US010854273B1

(12) United States Patent
Sato

(10) Patent No.: US 10,854,273 B1
(45) Date of Patent: Dec. 1, 2020

(54) APPARATUSES AND METHODS FOR CONTROLLING WORD DRIVERS

(71) Applicant: Micron Technology, Inc., Boise, ID (US)

(72) Inventor: Toshiyuki Sato, Asaka (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/450,737

(22) Filed: Jun. 24, 2019

(51) Int. Cl.
*G11C 8/00* (2006.01)
*G11C 11/408* (2006.01)
*G11C 8/10* (2006.01)
*G11C 8/08* (2006.01)

(52) U.S. Cl.
CPC ............ *G11C 11/4085* (2013.01); *G11C 8/08* (2013.01); *G11C 8/10* (2013.01); *G11C 11/4087* (2013.01)

(58) Field of Classification Search
CPC ... G11C 11/4085; G11C 11/4087; G11C 8/08; G11C 8/10
See application file for complete search history.

(56) References Cited

U.S. PATENT DOCUMENTS

| 6,028,813 | A | 2/2000 | Choi |
| 6,178,122 | B1 | 1/2001 | Tomishima et al. |
| 6,337,832 | B1 | 1/2002 | Ooishi et al. |
| 6,421,295 | B1 | 7/2002 | Mao et al. |
| 6,507,532 | B1 | 1/2003 | Fujino et al. |
| 7,251,160 | B2 | 7/2007 | Li et al. |
| 7,492,640 | B2 | 2/2009 | Mokhlesi |
| 7,529,131 | B2 | 5/2009 | Iwai et al. |
| 8,358,535 | B2 | 1/2013 | Chae et al. |
| 8,395,936 | B2 | 3/2013 | Li et al. |
| 8,804,446 | B2 * | 8/2014 | Okahiro .................. G11C 7/08 365/203 |
| 8,891,325 | B2 * | 11/2014 | Choi ..................... G11C 29/024 365/203 |
| 8,953,407 | B2 | 2/2015 | Yun et al. |
| 9,111,633 | B2 | 8/2015 | Kim |
| 9,373,378 | B1 | 6/2016 | Chen |
| 9,412,447 | B1 | 8/2016 | Bertin et al. |
| 9,418,711 | B2 * | 8/2016 | Ohgami ................ G11C 5/025 |

(Continued)

FOREIGN PATENT DOCUMENTS

KR 20140136766 A 12/2014

OTHER PUBLICATIONS

U.S. Appl. No. 16/450,696 titled "Apparatuses and Methods for Controlling Word Line Discharge" filed Jun. 24, 2019, pp. all.

(Continued)

*Primary Examiner* — Gene N Auduong
(74) *Attorney, Agent, or Firm* — Dorsey & Whitney LLP

(57) ABSTRACT

Apparatuses and methods for controlling the discharge of subword lines are described. The rate of discharge and/or the voltage level discharged to may be controlled. In some embodiments, a main word line may be driven to multiple low potentials to control a discharge of a subword line. In some embodiments, a first word driver line signal and/or a second word driver line signal may be reset to control a discharge of a subword line. In some embodiments, a combination of driving the main word line and the first word driver line signal and/or the second word driver line signal resetting may be used to control a discharge of the subword line.

20 Claims, 10 Drawing Sheets

(56) References Cited

U.S. PATENT DOCUMENTS

| | | | |
|---|---|---|---|
| 9,653,131 B1* | 5/2017 | Yamanaka | G11C 8/08 |
| 9,824,746 B1* | 11/2017 | Lee | G11C 11/406 |
| 9,922,726 B2* | 3/2018 | Choi | G01R 31/3181 |
| 10,008,256 B1 | 6/2018 | Kim | |
| 10,014,063 B2 | 7/2018 | Tseng et al. | |
| 10,347,321 B1 | 7/2019 | Yamanaka et al. | |
| 10,490,256 B2* | 11/2019 | Jeong | G11C 5/06 |
| 10,529,400 B1 | 1/2020 | Mahatme et al. | |
| 10,614,893 B2 | 4/2020 | Miyazaki | |
| 10,636,469 B2 | 4/2020 | El-mansouri et al. | |
| 10,650,882 B2 | 5/2020 | Lin et al. | |
| 10,665,271 B2 | 5/2020 | Takeda et al. | |
| 10,672,443 B2 | 6/2020 | Gupta et al. | |
| 10,685,709 B2 | 6/2020 | Tanaka et al. | |
| 2002/0001215 A1 | 1/2002 | Fujisawa et al. | |
| 2002/0051377 A1 | 5/2002 | Choi et al. | |
| 2002/0080677 A1 | 6/2002 | Watanabe et al. | |
| 2003/0095438 A1 | 5/2003 | Hosogane | |
| 2004/0004899 A1 | 1/2004 | Choi | |
| 2004/0052146 A1 | 3/2004 | Sim | |
| 2004/0156260 A1 | 8/2004 | Lee | |
| 2004/0196719 A1 | 10/2004 | Aritomi et al. | |
| 2005/0128858 A1 | 6/2005 | Lee et al. | |
| 2005/0226086 A1 | 10/2005 | Sugawara | |
| 2006/0158953 A1 | 7/2006 | Takahashi | |
| 2006/0176758 A1 | 8/2006 | Chun | |
| 2007/0008807 A1 | 1/2007 | Jeong | |
| 2007/0030741 A1 | 2/2007 | Nii et al. | |
| 2008/0031060 A1 | 2/2008 | Choi et al. | |
| 2008/0123463 A1 | 5/2008 | Matsubara | |
| 2009/0161418 A1 | 6/2009 | Yoon | |
| 2010/0046313 A1 | 2/2010 | Lee et al. | |
| 2010/0142306 A1* | 6/2010 | Nakamura | G11C 8/18 365/227 |
| 2010/0149900 A1 | 6/2010 | Kitayama | |
| 2010/0157716 A1 | 6/2010 | Lee | |
| 2011/0199837 A1 | 8/2011 | Reohr et al. | |
| 2011/0228624 A1 | 9/2011 | Kim et al. | |
| 2012/0120751 A1* | 5/2012 | Okahiro | G11C 7/08 365/207 |
| 2012/0147686 A1 | 6/2012 | Takayama et al. | |
| 2012/0257437 A1 | 10/2012 | Seko et al. | |
| 2012/0287699 A1 | 11/2012 | Yun et al. | |
| 2012/0327108 A1 | 12/2012 | Kato et al. | |
| 2013/0135915 A1 | 5/2013 | Kim | |
| 2013/0215697 A1 | 8/2013 | Choi et al. | |
| 2013/0329495 A1 | 12/2013 | Shiino et al. | |
| 2014/0369149 A1 | 12/2014 | Park | |
| 2015/0098260 A1* | 4/2015 | Ohgami | G11C 5/02 365/51 |
| 2015/0255146 A1 | 9/2015 | Mochida | |
| 2015/0364174 A1 | 12/2015 | Ahn et al. | |
| 2016/0095178 A1 | 3/2016 | Kuang et al. | |
| 2017/0075595 A1 | 3/2017 | Maejima | |
| 2017/0103798 A1 | 4/2017 | Mochida | |
| 2017/0178751 A1 | 6/2017 | Choi | |
| 2017/0271021 A1 | 9/2017 | Futatsuyama et al. | |
| 2017/0278579 A1 | 9/2017 | Lee et al. | |
| 2018/0040362 A1 | 2/2018 | Kwak et al. | |
| 2018/0074896 A1 | 3/2018 | Takada et al. | |
| 2018/0166119 A1 | 6/2018 | Jeong | |
| 2018/0277182 A1 | 9/2018 | Inaba | |
| 2019/0013055 A1 | 1/2019 | Ohgami | |
| 2019/0035466 A1 | 1/2019 | Kim et al. | |
| 2019/0088333 A1 | 3/2019 | Shirakawa et al. | |
| 2019/0180812 A1 | 6/2019 | Sung et al. | |
| 2019/0189186 A1 | 6/2019 | Won et al. | |
| 2019/0214293 A1 | 7/2019 | Kim et al. | |
| 2019/0385649 A1 | 12/2019 | Kawamura | |
| 2020/0027489 A1 | 1/2020 | Choi et al. | |
| 2020/0075110 A1 | 3/2020 | Suzuki et al. | |
| 2020/0105352 A1 | 4/2020 | Tanzawa | |
| 2020/0111517 A1 | 4/2020 | Seo et al. | |
| 2020/0143890 A1 | 5/2020 | Lee | |
| 2020/0152249 A1 | 5/2020 | Kawamura | |
| 2020/0294571 A1 | 9/2020 | Shin | |
| 2020/0295021 A1 | 9/2020 | Maejima | |

OTHER PUBLICATIONS

U.S. Appl. No. 16/450,723 titled "Apparatuses and Methods for Controlling Word Line Discharge" filed Jun. 24, 2019, pp. all.

International Application No. PCT/US20/26423, titled "Apparatuses and Methods for Controlling Word Line Discharge", dated Apr. 2, 2020, pp. all.

U.S. Appl. No. 16/584,746 titled "Apparatuses and Methods for Dynamic Timing of Row Pull Down Operations" filed Sep. 26, 2019, pp. all.

U.S. Appl. No. 16/378,524 titled "Apparatuses and Methods for Controlling Driving Signals in Semiconductor Devices" filed Apr. 8, 2019, pp. all.

U.S. Appl. No. 16/382,856 titled "Apparatuses and Methods for Controlling Word Line Discharge" filed Apr. 12, 2019, pp. all.

U.S. Appl. No. 16/853,417, titled "Apparatuses and Methods for Providing Main Word Line Signal With Dynamic Well", filed Apr. 20, 2020, pp. all.

U.S. Appl. No. 17/038,604 titled "Apparatuses and Methods for Controlling Word Line Discharge" filed Sep. 30, 2020; pp. all.

* cited by examiner

APPARATUSES AND METHODS FOR CONTROLLING WORD DRIVERS

BACKGROUND

A semiconductor memory device represented by a DRAM (Dynamic Random Access Memory) includes a memory cell array having memory cells disposed at intersections between word lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FXL) selected by a second portion of the row address.

A memory cell array included in a semiconductor memory device such as the DRAM may be divided into a plurality of memory mats to reduce the wiring capacitance of the subword lines and the bit lines. Each memory mat includes respective main word lines so that when the main word line is selected using the first portion of the row address, the memory mat to be selected is also determined at the same time.

The driving process of the subword lines is carried out by subword drivers, and when a subword line is driven to a high potential, the memory cell is coupled to the corresponding bit line. On the other hand, during a period in which the subword line is driven to a low potential, the memory cell and the bit line are kept in a cut-off state. In driving subword lines to the high potential, relatively high voltages are provided to the subword drivers of a memory mat. In contrast, in driving the subword line to a low potential, relatively low voltages are provided to the subword drivers of the memory mat.

Repeated access to a particular subword line, often referred to as a 'row hammer,' may cause an increased rate of data degradation in nearby subword lines. Reducing the effect of a row hammer event is desired.

DETAILED DESCRIPTION

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

A semiconductor memory device may include hierarchically structured main word lines and subword lines. The main word line is a word line positioned at an upper hierarchy, and is selected by a first portion of a row address. The subword line (SWL) is a word line positioned at a lower hierarchy, and is selected based on a corresponding main word line (MWL) and a word driver line (FXL), which is selected by a second portion of the row address. The MWL may be driven by main word drivers (MWD) and the word driver line FXL may be driven by word drivers (FXD). Both the MWL and FXL must be driven to active states to select the desired subword line SWL in the memory device.

Some research suggests that data degradation due to a row hammer event may be caused by a free electron generated in a back-gate region when a channel of a transistor disappears. Without being bound to a particular theory, row hammer effects may be mitigated by reducing the rate of channel dissipation in some applications. As described herein, the discharge of a subword line may be controlled. For example, the rate of discharge and/or the voltage to which the subword line discharges may be controlled. As described herein, in some embodiments, the discharge of the subword line may be controlled by driving a main word line MWL to a first low potential and subsequently to a second low potential, less than the first potential. The second low potential may be a negative voltage. In some embodiments, the main word line MWL may be driven to a single low potential that has a negative voltage. In some embodiments, the discharge of the subword line may be controlled by resetting a first word driver line signal and/or a second word driver line signal. In some embodiments, the discharge of the subword line may be controlled by a combination of driving a main word line MWL to one or more low potentials and resetting a first word driver line signal and/or a second word driver line signal. In some applications, controlling the discharge of the subword line may reduce the effects of a row hammer event.

Figure 1:
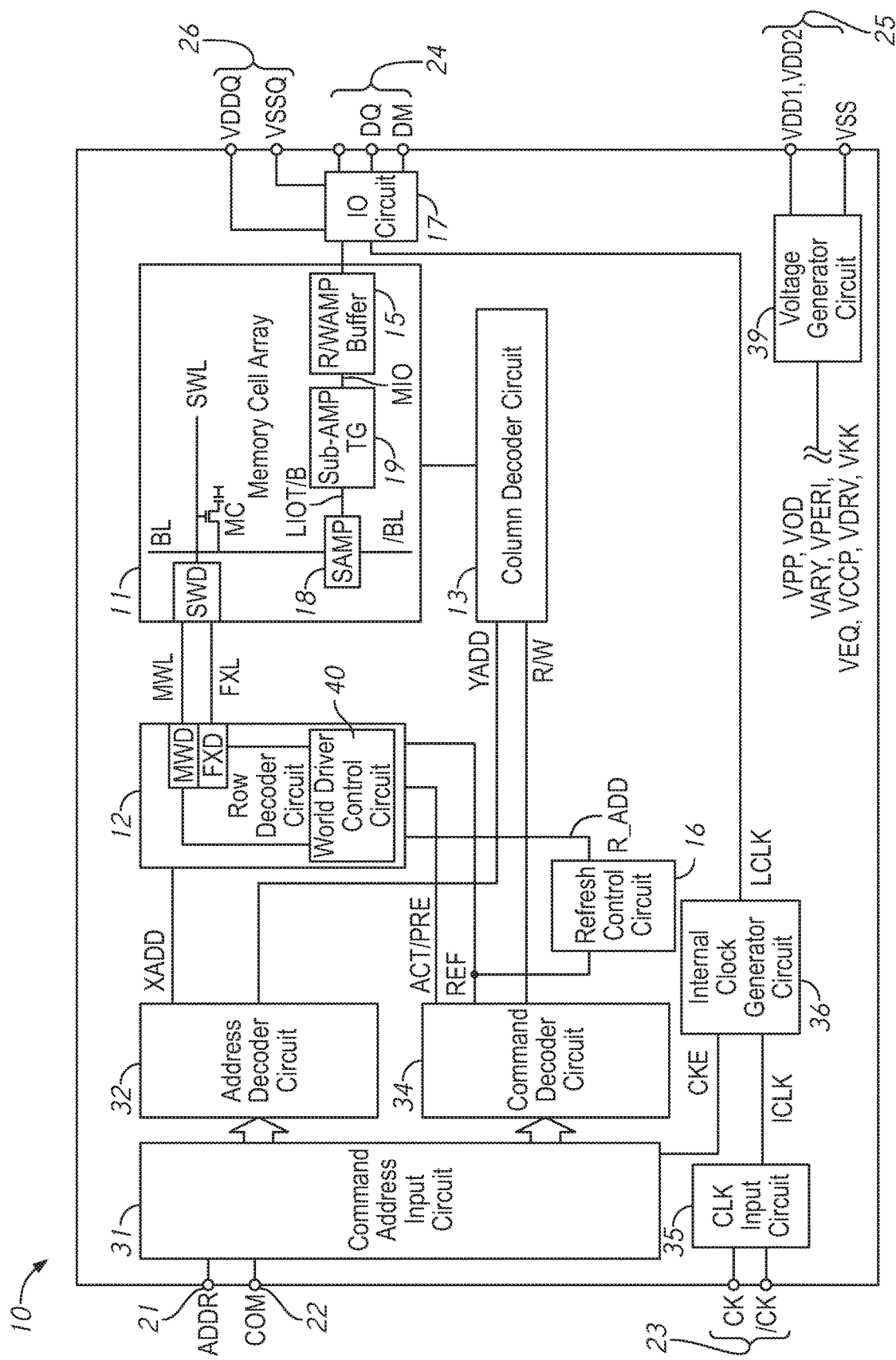
FIG. 1 is a block diagram of a semiconductor device according to an embodiment of the disclosure.

FIG. 1 is a block diagram of a semiconductor device 10 according to an embodiment of the disclosure. The semiconductor device 10 may be a dynamic random access memory (DRAM) in some embodiments of the disclosure. The semiconductor device 10 includes a memory cell array 11. The memory cell array 11 includes a plurality of subword lines SWL and a plurality of bit lines BL that intersect with each other, with memory cells MC disposed at the intersections. The SWL may be driven by subword drivers SWD. For clarity, only one SWL, SWD, BL, and MC are shown in FIG. 1. A plurality of main word lines MWL and word driver lines FXL are coupled between a row decoder circuit 12 and the SWD. The selection of a main word line MWL and a word driver line FXL is carried out by the row decoder circuit 12. Specifically, the row decoder circuit 12 may control main word drivers (MWD) and word drivers (FXD) to select the main word lines MWL and word driver lines FXL. For clarity, only one MWD and FXD are shown. The selection of the bit line BL is carried out by a column decoder circuit 13. Sense amplifiers 18 are coupled to corresponding bit lines BL and coupled to local I/O line pairs LIOT/B. Local 10 line pairs LIOT/B are coupled to main 10 line pairs MIOTB via transfer gates TG 19 which function as switches to read/write amplifiers and buffers 15.

Turning to the explanation of a plurality of external terminals included in the semiconductor device 10, the plurality of external terminals includes address terminals 21, command terminals 22, clock terminals 23, data terminals 24, and power supply terminals 25 and 26.

The address terminals 21 are provided with an address signal ADD. The address signal ADD is provided to the address terminals 21 are transferred via a command/address input circuit 31 to an address decoder circuit 32. The address decoder circuit 32 receives the address signal ADD and supplies a decoded row address signal XADD to the row decoder circuit 12, and a decoded column address signal YADD to the column decoder circuit 13.

The command terminals 22 are provided with a command signal COM. The command signal COM may include one or more separate signals. The command signal COM input to the command terminals 22 is input to a command decoder circuit 34 via the command/address input circuit 31. The command decoder circuit 34 decodes the command signal COM to provide various internal command signals. For example, the command decoder circuit 34 may activate an activation signal ACT in response to an activation command and/or a refresh signal REF in response to a refresh command. For example, the internal commands may include a row command signal to select a word line and a column command signal, such as a read command or a write command, to select a bit line.

When a row activation command is issued and a row address is timely provided with the activation command, and a column address is timely provided with a read command, read data is read from a memory cell MC in the memory cell array 11 designated by these row address and column address. More specifically, the row decoder circuit 12 selects a main word line MWL, word driver line FXL, and subword line SWL indicated by the row address RA indicated by XADD so that the associated memory cell MC is subsequently coupled to the bit line BL. The read data DQ is output externally from the data terminals 24 via a read/write amplifier 15 and an input/output circuit 17. Similarly, when the row activation command is issued and a row address are timely provided with the activation command, and a column address is timely provided with a write command, the input/output circuit 17 may receive write data DQ at the data terminals 24. The write data DQ is provided via the input/output circuit 17 and the read/write amplifier 15 to the memory cell array 11 and written in the memory cell MC designated by the row address and the column address.

The row decoder circuit 12 may include a word driver control circuit 40 in some embodiments. The word driver control circuit 40 may receive an activation signal ACT from the command decoder circuit 34. In some embodiments, the word driver control circuit 40 may receive additional signals. The word driver control circuit 40 may provide control signals to one or more word drivers included in the row decoder circuit 12, such as the main word driver MWD and/or word driver FXD.

The device 10 may include a refresh control circuit 16 for carrying out refresh operations. The refresh operations may be an auto-refresh operation and/or other refresh operations. In some embodiments, a refresh command may be externally issued to the device 10 and provided to the command decoder circuit 34 which provides the command to the refresh control circuit 16 and row decoder circuit 12. In some embodiments, the refresh command may be periodically provided by a component of the device 10 (e.g., internally by the refresh control circuit 16 or the command decoder circuit 34). The refresh control circuit 16 may provide a refresh address R_ADD to the row decoder circuit 12, which may indicate a row address for performing a refresh operation.

The clock terminals 23 are provided with external clock signals CK and /CK, respectively. These external clock signals CK and /CK are complementary to each other and are provided to a clock input circuit 35. The clock input circuit 35 receives the external clock signals CK and /CK and provides an internal clock signal ICLK. The internal clock signal ICLK is provided to an internal clock generator 36 and thus a phase controlled internal clock signal LCLK is provided based on the received internal clock signal ICLK and a clock enable signal CKE from the command/address input circuit 31. Although not limited thereto, a DLL circuit can be used as the internal clock generator 36. The phase controlled internal clock signal LCLK is provided to the input/output circuit 17 and is used as a timing signal for determining an output timing of the read data DQ.

The power supply terminals 25 are provided with power supply voltages VDD1, VDD2, and VSS. These power supply voltages VDD1, VDD2, and VSS are provided to an internal voltage generator circuit 39. The internal voltage generator circuit 39 provides various internal voltages VPP, VOD, VARY, VPERI, VEQ, VCCP, VDRV, VNRD, VNWL, and VOFF.

The internal potentials VCCP, VDRV, VNRD and VOFF are potentials which may be mainly used in the row decoder circuit 12 in some embodiments. VSS may also be used by row decoder circuit 12. For example, VSS may be used as a low potential and VCCP may be used as a high potential in some embodiments. VNRD may be a negative voltage in some embodiments. In some embodiments VOFF may be a low potential, but a potential greater than VSS. Although the detailed description thereof will be given later, the row decoder circuit 12 drives the main word line MWL and subword line SWL, selected based upon the address signal ADD, to a VCCP level corresponding to a high potential (e.g., 3.1 V) so that a cell transistor of the memory cell MC is turned on.

The internal potential VARY and VEQ is a potential to be used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are provided with power supply voltages VDDQ and VSSQ. These power supply voltages VDDQ and VSSQ are provided to the input/output circuit 17. The power supply voltages VDDQ and VSSQ may be the same voltages as the power supply voltages VDD2 and VSS that are provided to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
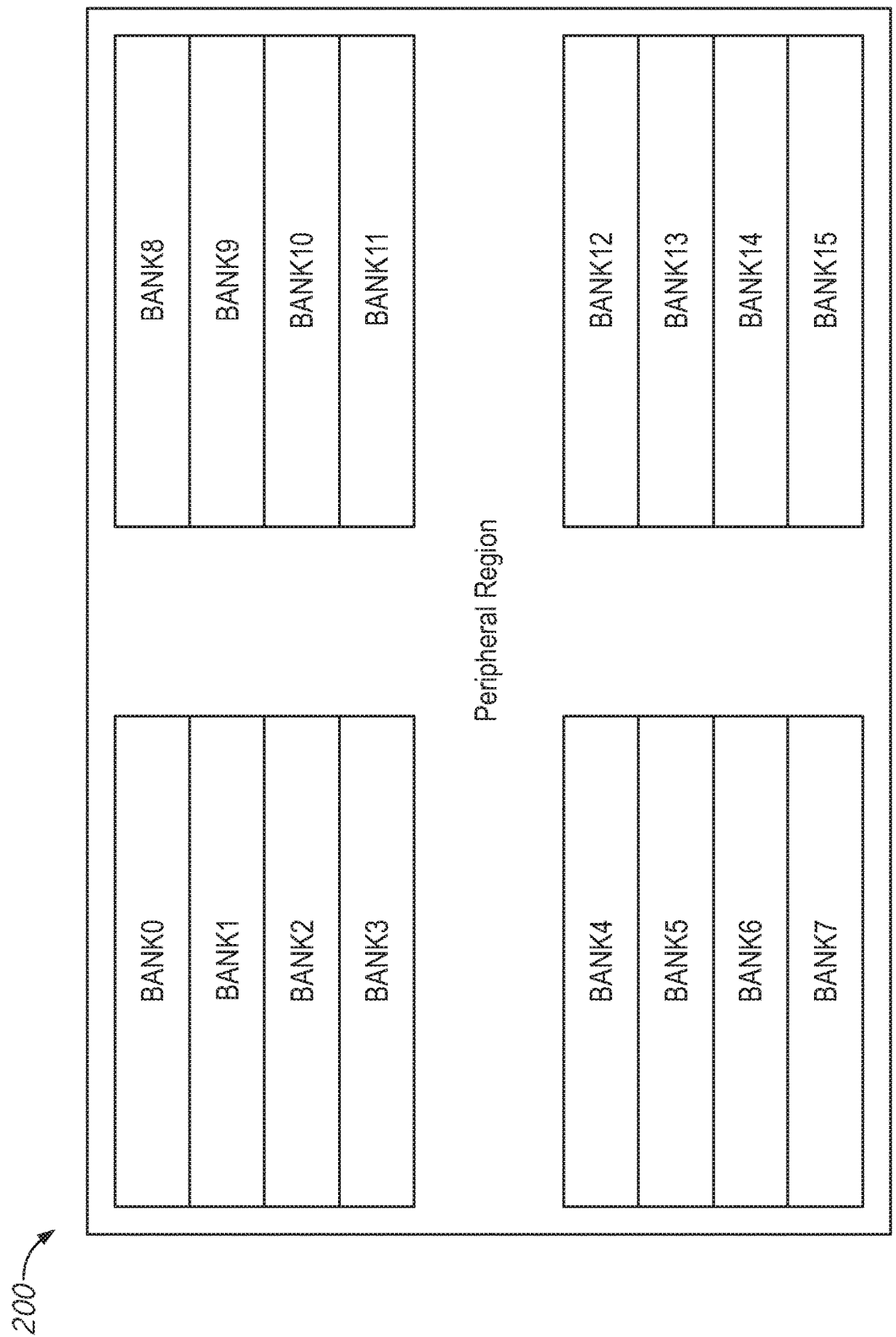
FIG. 2 is a diagram for a layout of a semiconductor device according to an embodiment of the disclosure.

FIG. 2 is a diagram for an example layout of a memory cell array of a semiconductor device according to an embodiment of the disclosure. In some embodiments of the disclosure, the memory cell array may be included in the memory cell array 11 of the semiconductor device 10 shown in FIG. 1.

The memory cell array 200 of the example shown in FIG. 2 is divided into sixteen banks BK0 to BK15. A row decoder circuit (e.g., row decoder circuit 12 of FIG. 1; not shown in FIG. 2) may be disposed between adjacent banks and/or in the peripheral circuit region PE. In the peripheral circuit region PE, various peripheral circuits and external terminals may be disposed (not shown in FIG. 2).

Figure 3:
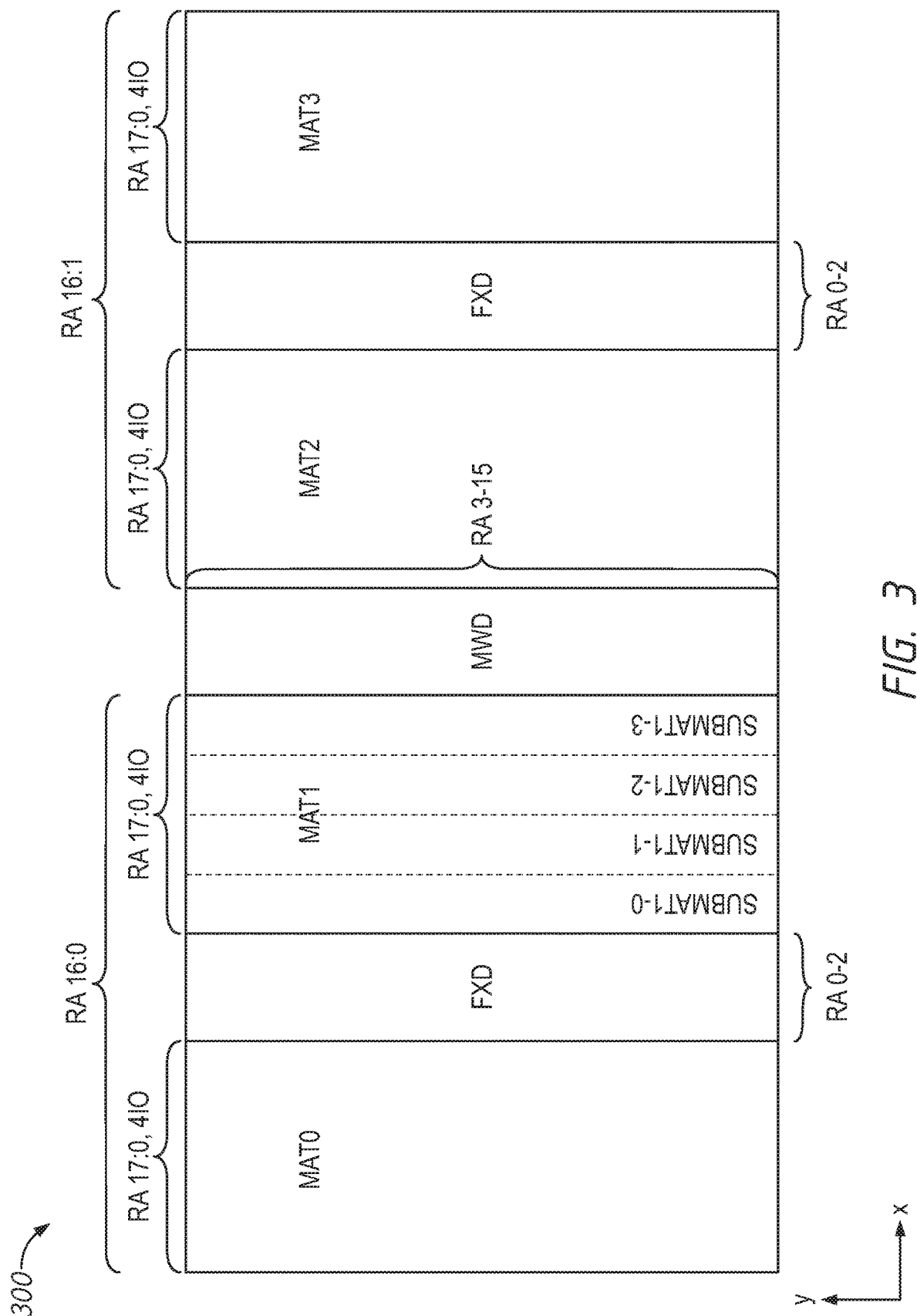
FIG. 3 is a diagram for a configuration of a bank of a memory cell array of a semiconductor device according to an embodiment of the disclosure.

FIG. 3 is a diagram for an example configuration of a bank 300 of a memory cell array according to an embodiment of the disclosure. The banks BK0 to BK15 of FIG. 2 may each include the configuration of the bank 300 of FIG. 3 in some embodiments of the disclosure. In some embodiments, the bank 300 may be included in memory cell array 11 of the semiconductor device 10 shown in FIG. 1.

As shown in FIG. 3, the bank 300 includes a plurality of memory mat regions MAT0-3. In the example shown in FIG. 3, the bank 300 has four memory mat regions, but the bank 300 could include more or fewer memory mat regions in other examples. As indicated by the dotted lines in memory mat region MAT1, each memory mat region may be divided into multiple sub-regions SUBMAT1-0-3. While the example shown in FIG. 3 includes four sub-regions, memory mat regions MAT0-3 may include more or fewer sub-regions in other examples. Each sub-region SUBMAT-0-3 may include a plurality of memory mats (e.g., 32, 64, 128) aligned in the Y-direction. In some embodiments, the plurality of memory mats in a sub-region may be further sub-divided into sets. For example, SUBMAT-0 may include 64 memory mats and the memory mats may be organized into eight sets of eight. For clarity, the individual memory mats are not shown in FIG. 3. The memory mats of each sub-region SUBMAT1-0-3 may be associated with a corresponding IO (e.g., DQ pad) in some embodiments.

The subword driver operations are controlled by a row decoder circuit (not shown in FIG. 3), for example, the row decoder circuit 12 of FIG. 1. When a row address RA is input thereto, the row decoder selects a subword line by activating an appropriate main word driver (MWD) and an appropriate word driver (FXD) indicated by the row address RA. In the example shown in FIG. 3, one block is shown for the main word driver MWD, however, the main word driver MWD block may include a plurality of main word drivers MWDs. Similarly, two blocks are shown for the word drivers FXDs, but each word driver FxD block may include a plurality of word drivers FXDs. For example, if each memory mat region MAT includes four sub-regions and each sub-region includes 64 memory mats, the main word driver MWD block may include 128 MWD, each configured to activate a corresponding main word line (MWL). Continuing this example, each word driver FxD block may include eight word drivers FXDs, each configured to activate a corresponding word driver line (FXL). In the example shown in FIG. 3, bits 3-15 of the row address RA encode the main word line MWL and bits 0-2 of the row address RA encode the word driver line FXL. However, other encoding schemes may be used.

Figure 4:
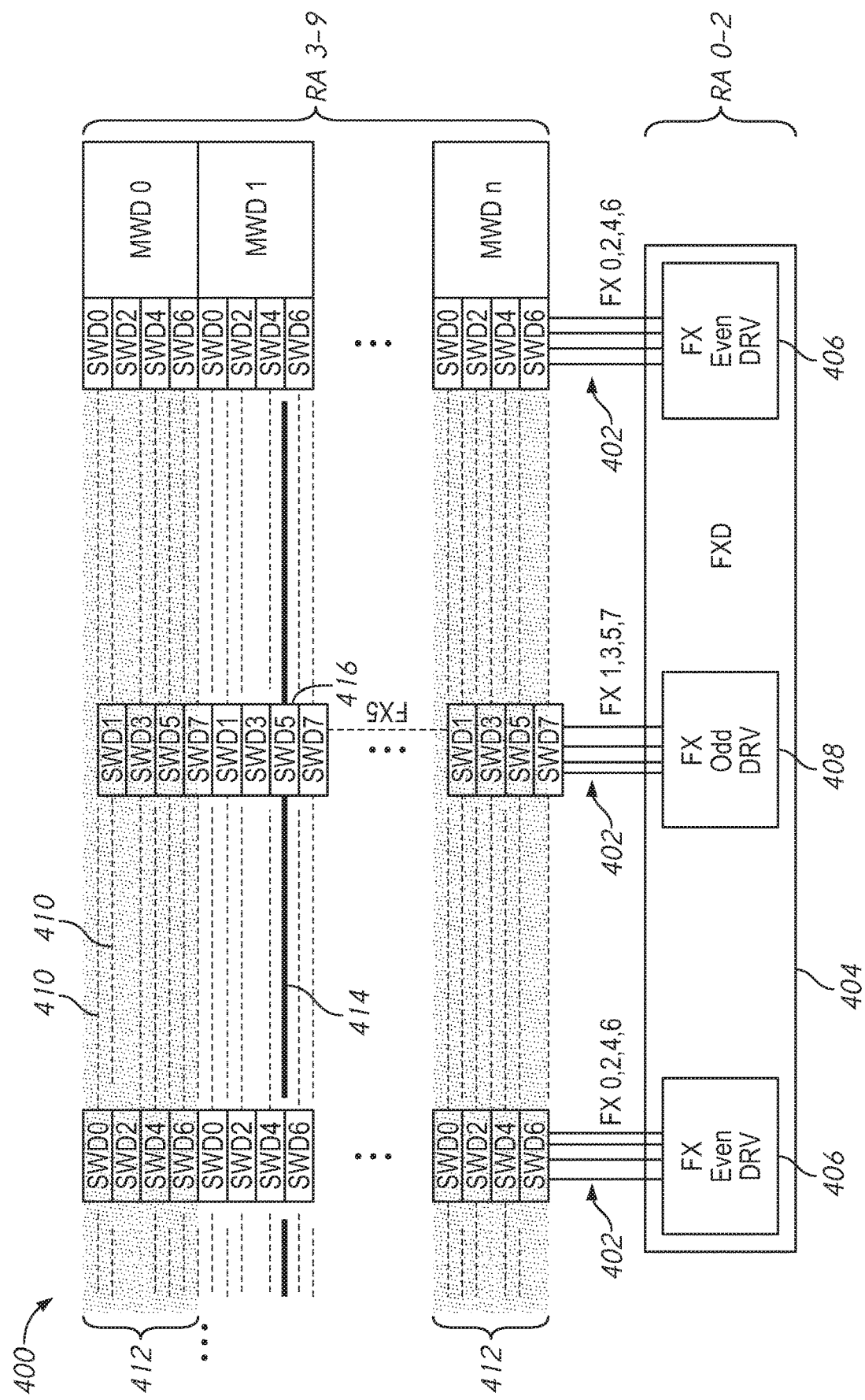
FIG. 4 is a schematic diagram of a portion of a bank of a memory cell array according to an embodiment of the disclosure.

FIG. 4 is a schematic diagram of a portion of a bank 400 according to an embodiment of the disclosure. In some embodiments of the disclosure, the portion of the bank 400 shown in FIG. 4 may be included in the bank 300 of FIG. 3, the memory cell array 200 of FIG. 2, and/or the memory cell array 11 of FIG. 1.

The subword lines are adjacent to each other, and driven by subword drivers SWD0-7 of different subword driver groups. Corresponding main word signals (not shown), driving signals FX, and low potential VSS (not shown) are provided to the subword drivers SWD0-7. In some embodiments, other potentials may be provided, such as a negative voltage VNRD and/or low potential VOFF. In some embodiments, the main word signals and the driving signals FX are signals that may be provided by main word drivers MWD0-N and word drivers FXD 404, respectively, included with the row decoder circuit, such as row decoder circuit 12 shown in FIG. 1, based upon the row address RA as described with reference to FIG. 3. The main word signal is provided to the subword drivers SWD0-7 over a main word line (not shown in FIG. 4), and the driving signals FX are provided to the subword drivers SWD0-7 over word driver lines 402.

A main word line MWL may extend over array regions of a respective memory mat (e.g., a memory mat in SUBMAT1-0 in FIG. 3) to provide the main word signal to the subword driver groups of the memory mat to activate the subword drivers SWD0-7 of the memory mat. That is, when a main word driver MWD is activated, it may provide active main word signals to all the subword drivers SWD0-7 of the mat. As will be described below, the driving signals FX include complementary signals FXT and FXF. Each word driver line 402 of word driver FXD 404 provides driving signals FX to at least one subword driver SWD in each mat. In the example shown in FIG. 4, the word driver FXD 404 includes even word drivers 406 and odd word drivers 408. The even word drivers 406 provide respective driving signals to even numbered subword drivers SWD0, SWD2, SWD4, and SWD6, of each memory mat and odd word drivers 408 provide respective driving signals to odd numbered subword drivers SWD1, SWD3, SWD5, and SWD7 of each memory mat. However other arrangements may be used in other examples. In the example shown in FIG. 4, each line of the word driver FXD may be coupled to a corresponding subword driver SWD0-7 in each memory mat. For example, FXL 5 may be coupled to the subword driver SWD5 of each memory mat.

In the example memory operation shown in FIG. 4, a row address RA has indicated MWD1 should be activated (e.g., selected) and odd word driver FXD 408 associated with word driver line FXL 5 should be activated (e.g., selected). As a result, a main word line MWL (not shown in FIG. 4) associated with MWD1 and driving signals (e.g., FXT and FXF) on the word driver line FXL 5 may be driven to active states for at least a portion of the duration of the memory operation (e.g., active period) to activate subword driver SWD5 416.

As shown by the shaded regions 412, subword lines 410 associated with the main word drivers MWD0, MWDn remain inactive, even the subword lines associated with word driver line FXL 5. However, the subword line 414 driven by subword driver SWD5 416 associated with activated MWD1 and FXL 5 is activated to allow access to memory cells along subword line 414. Thus, a selected subword line SWL of the selected memory mat associated with MWD1 is driven to the high potential by the corresponding activated subword driver SWD5. In some examples, the other subword drivers SWD of the selected memory mat drive the respective unselected subword lines SWL to the low potential to remain inactive. Subword drivers SWD of unselected memory mats (e.g., memory mats associated with MWD0 and MWDn) remain deactivated, and the subword lines SWL of the unselected memory mats MAT are not provided a voltage in some examples. That is, while a subword driver SWD may be enabled by an active main word driver MWD or an active word driver FXD, in order to be activated, a subword line SWL must be associated with a subword driver SWD coupled to an activated word driver FXD and an activated main word driver MWD. After the memory cells of the selected subword line SWL have been accessed, the selected subword line SWL is then discharged to the low potential by deactivating the MWD and/or FXD as described herein.

According to some embodiments of the disclosure, the subword line SWL is discharged in a controlled manner. For example, a rate of discharge of the subword line SWL and/or a voltage the subword line SWL discharges to may be controlled.

Figure 5:
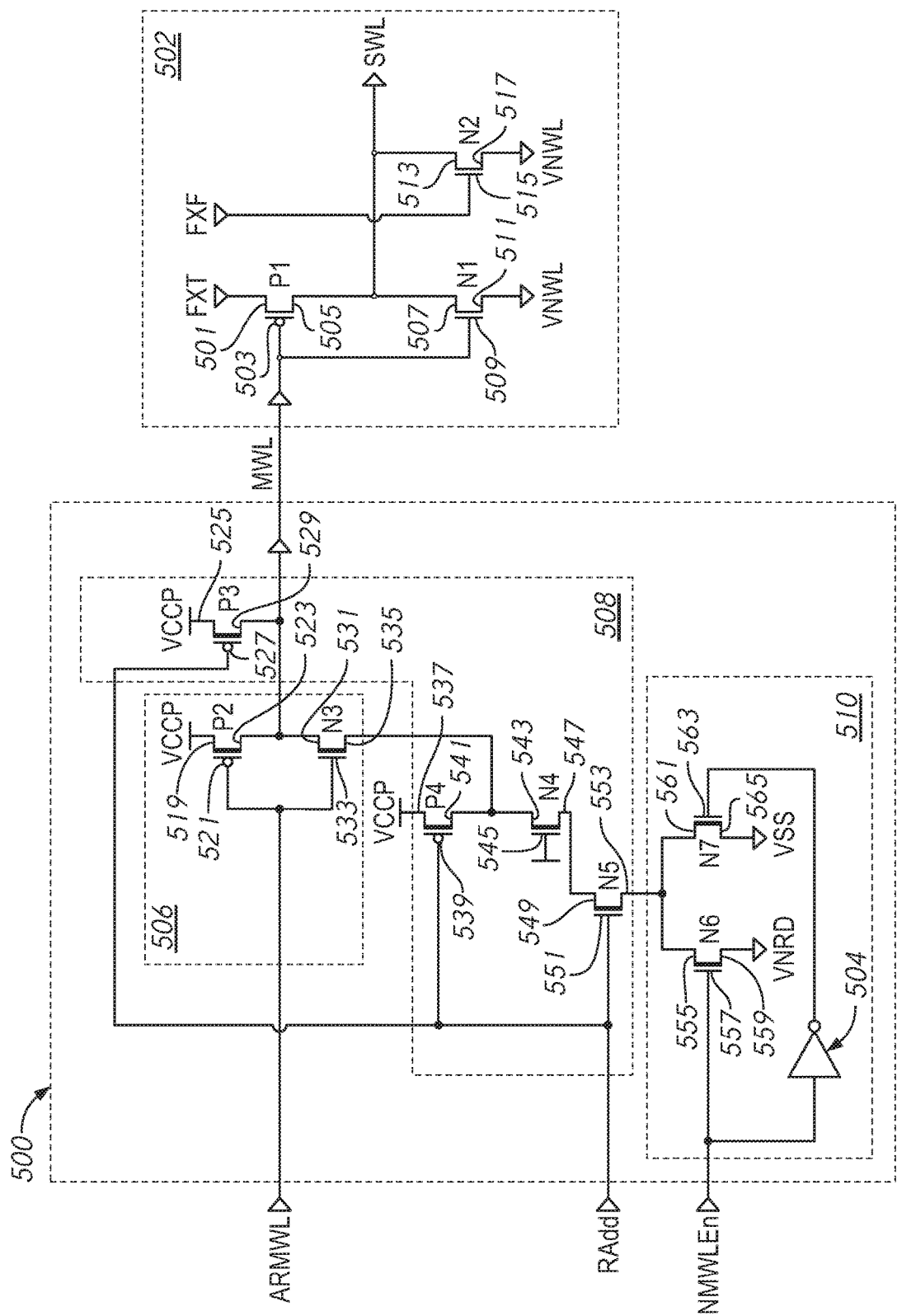
FIG. 5 is a circuit diagram of a main word driver according to an embodiment of the disclosure.

FIG. 5 is a circuit diagram of a main word driver MWD 500 according to an embodiment of the disclosure. MWD 500 may be included in the main word drivers in FIG. 1, FIG. 3, and/or FIG. 4 in some embodiments. For context, a subword driver SWD 502 is also shown. SWD 502 may be included in subword drivers in FIGS. 1 and 4 in some embodiments.

In the embodiment shown in FIG. 5, the SWD 502 includes a P-channel type field effect transistor P1 and N-channel type field effect transistors N1 and N2. The transistors P1 and N1 are series-coupled to each other at nodes 505 and 507, respectively, and a main word line MWL is provided to the gate electrodes 503 and 509, respectively. A driving signal FXT is provided to the node 501 (e.g., drain or source) of the transistor P1, and a low potential is provided to the node 511 (e.g., drain or source) of the transistor N1. While the low potential is VNWL in FIG. 5, other potentials may also be used (e.g., ground, negative voltage). The nodes (e.g., drains or sources) of the transistors P1 and N1 are coupled to subword line SWL. A driving signal FXF is provided to the gate 515 of the transistor N2, with its node 513 (e.g., drain or source) being coupled to the subword line SWL, and the low potential is provided to the node 517 (e.g., drain or source). As previously described, the main word line MWL is provided by main word driver MWD 500 and the driving signals FXT and FXF are provided by a word driver (not shown in FIG. 5) on word driver lines FXL.

The main word line MWL provides a low level when selected, and the driving signals FXT and FXF are signals that respectively become a high level and a low level when selected. The driving signals FXT and FXF are complementary signals. When the main word line MWL and the driving signals FXT and FXF are activated (e.g., MWL and FXF are low and FXT is high), transistors N1 and N2 are not activated, but the transistor P1 is activated to provide the FXT signal to activate the corresponding subword line SWL. In contrast, when the main word line MWL is in the inactive state, and either of the driving signals FXT and FXF is also in the inactive state, the corresponding subword line SWL is inactive. The potential to which the subword line SWL is driven for active and inactive states may be based, at least in part, on a potential of the FXT and/or FXF signals and/or MWL. For example, when FXT is driven to VCCP and FXF is driven to VSS, subword line SWL may be driven to VCCP when activated by MWL.

Returning to the main word driver MWD 500, various signals may be provided to control the operation of the MWD 500. In the example shown in FIG. 5, MWD 500 may receive an active row main word line signal ARMWL, an activation row address signal RAdd, and a negative main word line enable signal NMWLEn. In some embodiments, the control signals may be provided by a word driver control circuit, such as word driver control circuit 40 shown in FIG. 1. In some embodiments, RAdd and/or ARMWL may be provided by an address decoder circuit, such as address decoder 32 in FIG. 1. In other embodiments, RAdd and/or ARMWL may be provided by address decoder logic in a row decoder circuit, such as row decoder circuit 12 shown in FIG. 1, based, at least in part, on an address signal (e.g., XADD) provided by the address decoder circuit.

The MWD 500 may include a main word line enable circuit 506, a main word line activation circuit 508, and a negative main word line enable circuit 510. The main word line enable circuit 506 may receive ARMWL, the main word line activation circuit 508 may receive RAdd, and the negative main word line enable circuit 510 may receive NMWLEn. In some embodiments, the main word line enable circuit 506 may enable the main word line, that is, main word line enable circuit 506 may control whether or not the MWL can be driven to an active state. In some embodiments, the main word line activation circuit 508 may control when the MWL is driven to the active state when the MWL is enabled (e.g., by the main word line enable circuit 506). In some embodiments, the negative main word line enable circuit 510 may control the potential to which the main word line MWL is driven when activated. In the example shown in FIG. 5, the negative main word line enable circuit 510 determines whether the MWL is driven to VNRD or VSS when activated.

In some embodiments, the main word line enable circuit 506 includes a P-channel transistor P2 coupled between a high potential (e.g., VCCP as shown in FIG. 5) at node (e.g., source or drain) 519 and a main word line MWL at node 523. The gate 521 of P2 may receive ARMWL. The main word line enable circuit 506 may include an N-channel transistor N3 coupled to node 523 of P2 at node 531. N3 may also receive ARMWL at gate 533. Node 535 of N3 may be coupled to the main word line activation circuit 508. In the example in FIG. 5, Node 535 of N3 is coupled to node 571 of N-channel transistor N8.

In some embodiments, the main word line activation circuit 508 may include a P-channel transistor P3 coupled between a high potential (e.g., VCCP) at node 525 and the main word line MWL at node 529. The main word line activation circuit 508 may include P-channel transistor P4. The node 537 of P4 may be coupled to a high potential (e.g., VCCP). The gate 539 of P4 may receive RAdd. The node 541 of P4 may be coupled to node 567 of N-channel transistor N8. The gate 569 of N8 may be coupled to an activating potential sufficient to activate N8 (e.g., VCCP). The node 571 of N8 may be coupled to the main word line enable circuit 506. In some embodiments, transistor N8 may be omitted and node 541 of P4 may be coupled to the main word line enable circuit 506. In some embodiments, the node 571 of N8 may be further coupled to node 543 of N-channel transistor N4. The gate 545 of N4 may be coupled to an activating potential sufficient to activate N4 (e.g., VCCP). In some embodiments, N4 may be omitted. The node 547 of N4 may be coupled to node 549 of N-channel transistor N5. The gate 551 of N5 may receive RAdd. Node 553 of N5 may be coupled to the negative main word line enable circuit 510. In the example shown in FIG. 5, node 553 of N5 is coupled to node 555 of N-channel transistor N6 and node 561 of N-channel transistor N7.

Figure 6:
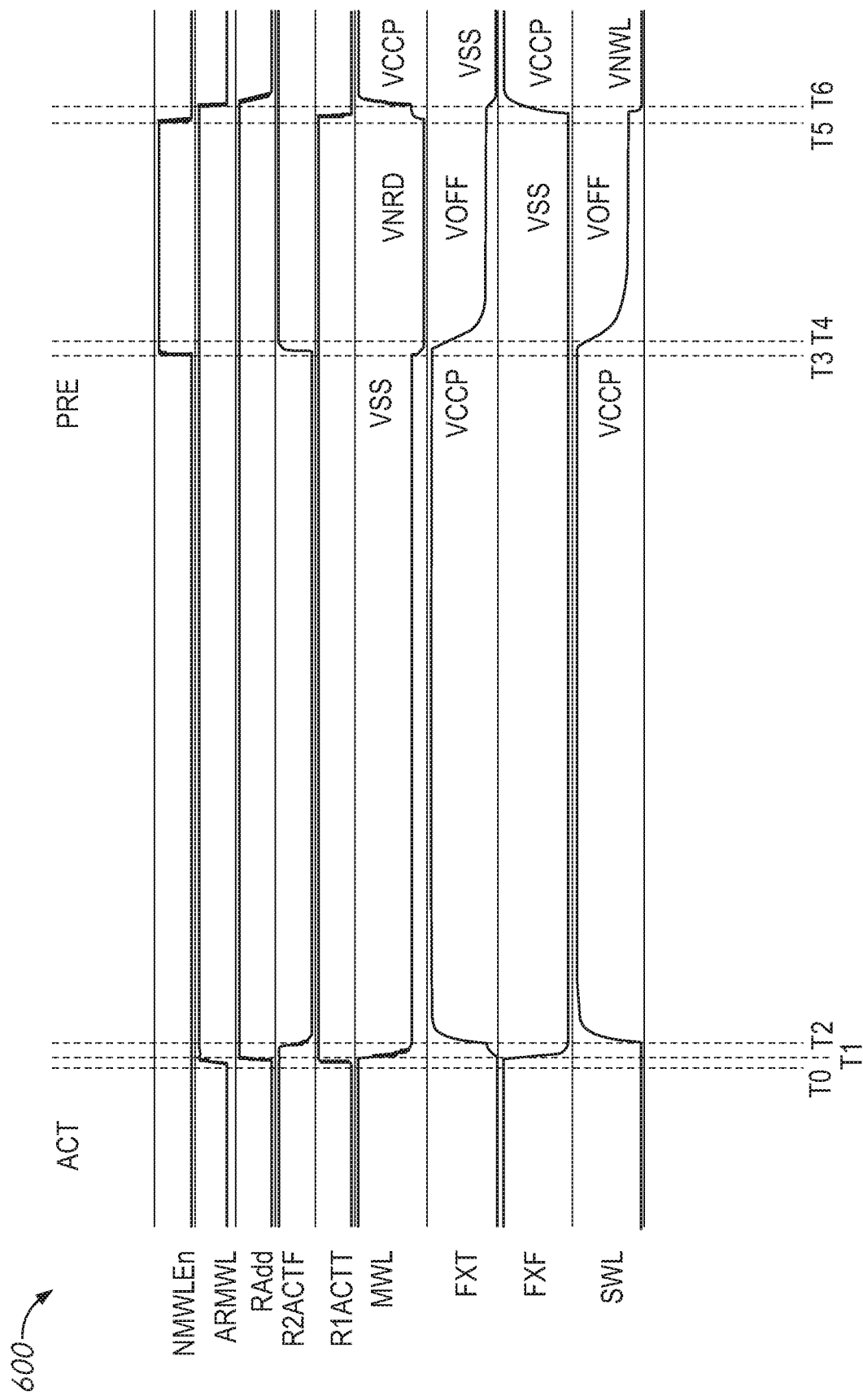
FIG. 6 is a timing diagram of various signals during operation of a driver circuit according to an embodiment of the disclosure.

The negative main word line enable circuit 510 may include N-channel transistors N6 and N7 with nodes 555 and 561, respectively, coupled to the main word line activation circuit 508. Node 559 of N6 and node 565 of N7 may be coupled to low potentials. In some embodiments, N6 may be coupled to a lower potential than N7. For example, as shown in FIG. 6, N6 is coupled to VNRD, which may be a negative voltage in some embodiments, and N7 is coupled to VSS, which may be a zero voltage in some embodiments. The gate 557 of N6 may receive NMWLEn and gate 563 of N7 may receive an inverted NMWLEn signal from inverter 504.

In operation, when ARMWL is low, transistor P2 may be active and N3 may be inactive. This may couple MWL to VCCP through P2, driving the MWL to an inactive (e.g., high potential) state. Thus, when ARMWL is low, the MWL may be inactive regardless of the states of RAdd and NMWLEn.

When ARMWL is high, P2 is inactive and N3 is active. Thus, the state of MWL may be based, at least in part, on the states of RAdd and/or NMWLEn. For example, when RAdd is low, N5 is inactive and P3 and P4 are active. This may couple MWL to VCCP through P3 and/or P4, driving MWL to an inactive high state regardless of the state of NMWLEn. When RAdd is high, N5 is active and P3 and P4 are inactive. When NMWLEn is low, N6 is inactive and N7 is active. As a result MWL is driven to VSS, an active low. When NMWLEn is high, N6 is active and N7 is inactive. In this state, MWL is driven to VNRD, an active low, which may be a negative voltage in some embodiments.

In some embodiments, MWL may be driven to the two different active low potentials. Driving MWL to a lower voltage (e.g., a negative voltage) for at least a period of time while MWL is active may control the discharge of the SWL. For example, driving MWL to a negative voltage (e.g., −0.5V, −1.0V), may increase the conductivity of P1 of the SWD 502 compared to when the MWL is driven to a low voltage (e.g., 0.0V, 0.5V) in some embodiments, and as a result, increase a rate of discharge of the SWL. In other embodiments, the MWL may be driven to the negative voltage for the entire time the MWD 500 is active. In these embodiments, NMWLEn remains high and keeps N6 activated to couple the MWL to VNRD when RAdd and ARMWL are active.

FIG. 6 is a timing diagram 600 of various signals during an operation of a driver circuit according to an embodiment of the disclosure. In some embodiments, timing diagram 600 may show the operation of a driver circuit during a memory access operation (e.g., activation). In some embodiments of the disclosure, the driver circuit of FIG. 5 may be operated according to the example operation of timing diagram 600. The timing diagram 600 will be described with reference to the driver circuit of FIG. 5. However, the example of FIG. 6 is not limited to the specific embodiment of the MWD 500.

Timing diagram 600 shows the states of signals NMWLEn, ARMWL, and RAdd. Timing diagram 600 further shows the states of a main word line MWL and a subword line SWL. Driving signals FXT and FXF are shown. Driving signals FXT and FXF may be provided by a word driver FXD, such as a word driver shown in FIGS. 1, 3, and/or 4. Signals R2ACTF and R1ACTT, shown in timing diagram 600, may control the states of the driving signals FXT and FXF in some embodiments. Signals R2ACTF and R1ACTT may be provided by a word driver control circuit, such as word driver control circuit 40 in FIG. 1, in some embodiments. While R2ACTF, R1ACTT, FXF, and FXT are provided for context in timing diagram 600, the specific implementation of these signals shown in timing diagram 600 are not required for operation of the driver circuit, such as MWD 500. Example implementations of word drivers FXD and control of driving signals FXT and FXF are provided with reference to FIGS. 7-10. However, other word drivers FXD and control of driving signals FXT and FXF may be used.

At some time before T0, an activation command is received by a memory device that includes the word driver. In response, an internal activation signal ACT may transition to an active state. The internal activation signal ACT may be received by a word driver control circuit, such as word driver control circuit 40 shown in FIG. 1. This may activate R2ACTF and/or R1ACTT responsive, at least in part, to the activated activation signal ACT at or around T0. Although not shown, an address signal may be provided to the memory device with the ACT signal to select a MWL and SWL for activation. ARMWL and RAdd may be activated in response to the address signal and/or ACT at or around T0. In some embodiments, ARMWL and/or RAdd may be provided by the word driver control circuit. In some embodiments, ARMWL and/or RAdd may be provided by another component of a row decoder circuit, such as row decoder circuit 12 shown in FIG. 1.

At or around T1, selected main word line MWL may transition to an active state (e.g., a low potential VSS in the example shown in FIG. 6) responsive to the active ARMWL and RAdd signals (e.g., a high potential in the example shown in FIG. 6). With reference to FIG. 5, when ARMWL and RAdd are high, transistors P2, P3, and P4 are inactive and transistors N3, N4, and N5 are active. NMWLEn is inactive (e.g., a low potential in the example shown in FIG. 6), so transistor N6 is inactive and transistor N7 is active. Thus, MWL is driven to VSS via transistors N3, N4, N5, and N7.

Also at or around T1, the word driver signals FXT and FXF may transition to their active states. In the example shown in FIG. 6, FXT has a high potential active state (e.g., VCCP) and FXF has a low potential active state (e.g., VSS). FXT and FXF may transition to the active states responsive, at least in part to R2ACTF and R1ACTT.

At or around T2, selected subword line may be driven to an active state (e.g., a high potential VCCP in the example shown in FIG. 6) responsive to the activation of MWL, FXT, and FXF. Referring to FIG. 5, transistor P1 may be active and transistors N1 and N2 may be inactive in the subword driver SWD to drive the selected SWL. The SWL may be coupled to the VCCP of FXT via transistor P1.

Sometime before T3, a precharge command may be received by the memory device. In response, an internal precharge signal PRE may transition to an active state. Responsive, at least in part to the precharge signal PRE, the word driver control circuit may activate NMWLEn at or around T3. Activation of NMWLEn may deactivate transistor N7 and activate transistor N6. This may decouple MWL from VSS via transistor N7 and couple MWL to VNRD via transistor N6. Thus, MWL may be driven to a negative voltage (e.g. approximately −0.5 volts in the example shown in FIG. 6) at or around T4. In the example shown in FIG. 6, in response to the precharge command PRE, R2ACTF transitions high around T3. In response, at or around T4, FXT is driven to an inactive potential, VOFF in the example shown in FIG. 6. VOFF may be an inactive potential that is greater than inactive potential VSS in some embodiments, such as the one shown in FIG. 6. At or around T4, SWL is driven to inactive potential VOFF through the activated P1 of the SWD 502, the same potential as FXT.

Driving the MWL to a negative voltage may increase a rate at which SWL is driven to a voltage of driving signal FXT through transistor P1 in some embodiments. Driving the MWL to a negative voltage may ensure that SWL may be driven to a voltage of FXT when FXT is driven to an inactive voltage greater than VSS in some embodiments. That is, driving MWL to a negative voltage may control, at least in part, a rate of discharge of SWL and/or a voltage to which SWL discharges in some embodiments.

At or around T5, NMWLEn returns to an inactive state (e.g., a low potential in the example shown in FIG. 6), and MWL is driven to VSS through transistor N7. Shortly thereafter, at or around T6, ARMWL and RADD transition to inactive states (e.g., a low potential in the example shown in FIG. 6), which deactivates transistors N5 and N3 and activates transistors P2, P3, and P4. As a result MWL is driven to an inactive potential (e.g., VCCP in the example shown in FIG. 6) via transistors P2 and P3. In some embodiments, NMWLEn may transition to an inactive state at the same time as ARMWL and RADD, and MWL may be driven directly from VNRD to VCCP.

In the example shown in FIG. 6, R1ACTT transitions to an inactive state (e.g., a low potential) at or around T6. In response, both FXT and FXF are driven to inactive states. In the example shown in FIG. 6, FXT is driven to VSS and FXF is driven to VCCP.

The deactivation of MWL, FXT, and FXF deactivates transistor P1 and activates transistors N1 and N2. As a result SWL is driven to inactive potential VNWL. In some embodiments, such as the one shown in FIG. 6, VNWL may be lower than VOFF. In some embodiments, VNWL may be the same as VSS.

In summary, the MWL may be driven to a first low potential (e.g., VSS) during a memory activation sequence (e.g., responsive to an activation command ACT). Responsive to a precharge command, MWL may be driven to a second low potential (e.g., VNRD), which may be lower than the first low potential. In some embodiments, the second low potential may be a negative voltage. After the activation sequence, MWL may be returned to a high potential (e.g., an inactive state).

In some embodiments, MWL may be driven to a negative voltage for the entire duration of the memory activation sequence rather than only during the precharge phase. For example, NMWLEn may remain active for the duration MWL is activated. In another example, MWD 500 may be modified to omit the negative main word line enable circuit 510. Specifically, transistors N6, N7, and signal NMWLEn may not be included. In this example, transistor N5 may be coupled directly to VNRD. In these embodiments, the main word line activation circuit 508 may drive the MWL to the potential responsive to the activation row address signal when the main word line is enabled by the main word line enable circuit 506. However, in some applications, driving MWL to a negative voltage for an entire activation period may increase degradation of one or more transistors, such as transistor P1, due to a greater electric field.

In some embodiments, controlling the discharge of a subword line SWL by driving a main word line MWL to a negative voltage may mitigate the effects of a row hammer on the subword line SWL. In some embodiments, the discharge of the subword line SWL may additionally or alternatively controlled by a word driver FXD and driving signals FXT and FXF.

Figure 7:
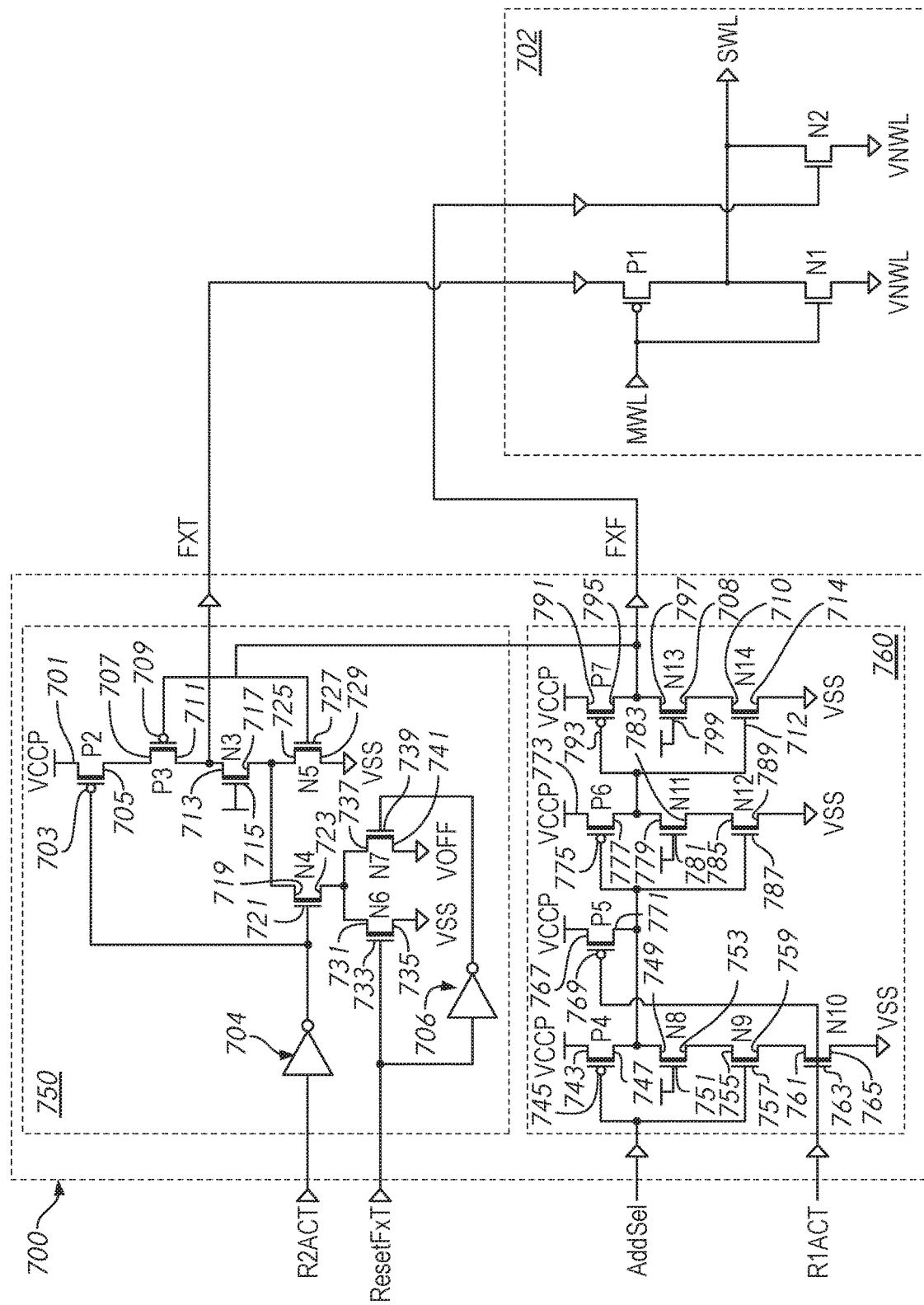
FIG. 7 is a circuit diagram of a word driver according to an embodiment of the disclosure.

FIG. 7 is a circuit diagram of a word driver FXD 700 according to an embodiment of the disclosure. FXD 700 may be included in the word drivers in FIG. 1, FIG. 3, and/or FIG. 4 in some embodiments. For context, a subword driver SWD 702 is also shown. SWD 702 may be included in subword drivers in FIGS. 1 and 4 in some embodiments. In some embodiments, MWL coupled to SWD 702 may be provided by a main word driver MWD, such as MWD shown in FIG. 1, MWD shown in FIG. 3, or MWD shown in FIG. 4, or MWD 500 shown FIG. 5. SWD 702 may be substantially the same as SWD 502 in some embodiments. Accordingly, for brevity, a detailed discussion of the structure and operation of SWD 702 is omitted.

The word driver FXD 700 may receive one or more signals in some embodiments. In the example shown in FIG. 7, FXD 700 receives control signal R2ACT, control signal R1ACT, driving signal reset control signal ResetFxT, and address select signal AddSel. In some embodiments, the signals may be provided by address decoder logic and/or a word driver control circuit of a row decoder circuit, such as row decoder circuit 12 shown in FIG. 1.

The word driver FXD 700 may include an FXT driver 750 and an FXF driver 760 (e.g., first and second driving signal drivers) in some embodiments. The FXT driver 750 may receive the R2ACT, ResetFxT, and driving signal FXF and provide the driving signal FXT. The FXF driver 760 may receive the AddSel signal and the R1ACT signals and provide the driving signal FXF.

FXT driver 750 may include a P-channel transistor P2 coupled to a high potential (e.g., VCCP) at a node 701. A second P-channel transistor P3 may be coupled at node 707 to node 705 of P2. Node 711 of transistor P3 may be coupled to node 713 of N-channel transistor N3. Word driving signal FXT may be provided between nodes 711 and 713. Node 717 of N3 may be coupled to node 719 of N-channel transistor N4 and node 725 of N-channel transistor N5. Node 729 of N5 may be coupled to a low potential (e.g., VSS). Node 723 of N4 may be coupled to node 731 of N-channel transistor N6 and node 737 of N-channel transistor N7. Node 735 of N6 may be coupled to a low potential (e.g., VSS). Node 741 of N7 may be coupled to a low potential (e.g., VOFF). In some embodiments, N7 may be coupled to a higher potential than N6 (e.g., VOFF may be greater than VSS). An inverter 704 may receive signal R2ACT and provide an inverted R2ACT signal to gate 703 of P2 and gate 721 of N4. Gate 733 of N6 may receive ResetFxT. Gate 739 of N7 may receive an inverted ResetFxT signal from inverter 706. Gate 709 of P3 and gate 727 of N5 may receive word driving signal FXF from FXF driver 760. Gate 715 of N3 may be coupled to a potential sufficient to activate N3 (e.g., VCCP). In some embodiments, the low potential VSS may be the same as the low potential VNWL of the subword driver 702.

FXF driver 760 may include a P-channel transistor P4 coupled to a high potential (e.g., VCCP) at node 743. Transistor P4 may be coupled in series with N-channel transistors N8, N9, and N10. Node 765 of transistor N10 may be coupled to a low potential (e.g., VSS). A P-channel transistor P5 may be coupled to a high potential (e.g., VCCP) at node 767 and to node 747 of P4 and node 749 of N8. FXF driver 760 may include P-channel transistor P6 coupled to a high potential at node 773. Transistor P6 may be coupled in series with N-channel transistors N11 and N12. Node 789 of N12 may be coupled to a low potential (e.g., VSS). FXF driver 760 may include P-channel transistor P7 coupled to a high potential (e.g., VCCP) at node 791. Transistor P7 may be coupled in series with N-channel transistors N13 and N14. The node 714 of N14 may be coupled to a low potential (e.g., VSS). Word driving signal FXF may be provided between node 795 of P7 and node 797 of N13. Gate 745 of P4 and gate 757 of N9 may receive signal AddSel. Gate 751 of N8 may receive a potential sufficient to activate N8 (e.g., VCCP). Gate 763 of N10 and gate 769 of P5 may receive control signal R1ACT. Gate 775 of P6 and gate 787 of N12 may be coupled to node 771 of P5, node 747 of P4, and node 749 of N8. Gate 781 of N11 may be coupled to a potential sufficient to activate N11 (e.g., VCCP). Gate 793 of P7 and gate 712 of N14 may be coupled to node 777 of P6 and node 779 of N1. Gate 799 of N13 may be coupled to a potential sufficient to activate N13 (e.g., VCCP).

As shown in FIG. 7, transistors P4 and N9, transistors P5 and N10, transistors P6 and N12, and transistors P7 and N14 may act as inverters in some embodiments. Transistors P4 and N9 may provide an inverted AddSel and transistors P5 and N10 may provide an inverted R1ACT. However, transistors P5 and N10 may only be effective when AddSel is active. Transistors P6 and N12 may provide and signal received from the nodes of P4 and P5 and transistors P7 and N14 may provide an inverted signal received from the node 795 of P7 as FXF. Thus, in other embodiments, the FXF driver 760 may include different transistors and/or logic circuitry that provides the equivalent functions of the inverters.

In some embodiments, transistors N3, N8, N11, and/or N13 may be included for maintaining voltage and/or current in the FXD 700. In some embodiments, transistors N3, N8, N11, and/or N13 may be omitted.

The FXD 700 may activate and deactivate word driving signals FXT and FXF based, at least in part, on the signals R2ACT, ResetFxT, AddSel, and R1ACT. The activating and deactivating of the word driving signals may enable/disable and/or activate/deactivate the subword line SWL. In some embodiments, the discharge of the subword line SWL may be controlled, at least in part, by the activating and deactivating of the word driving signals FXT and FXF. A more detailed explanation of the operation of the FXD 700 will be provided with reference to timing diagrams 900 and 1000 in FIGS. 9 and 10, respectively.

Figure 8B:
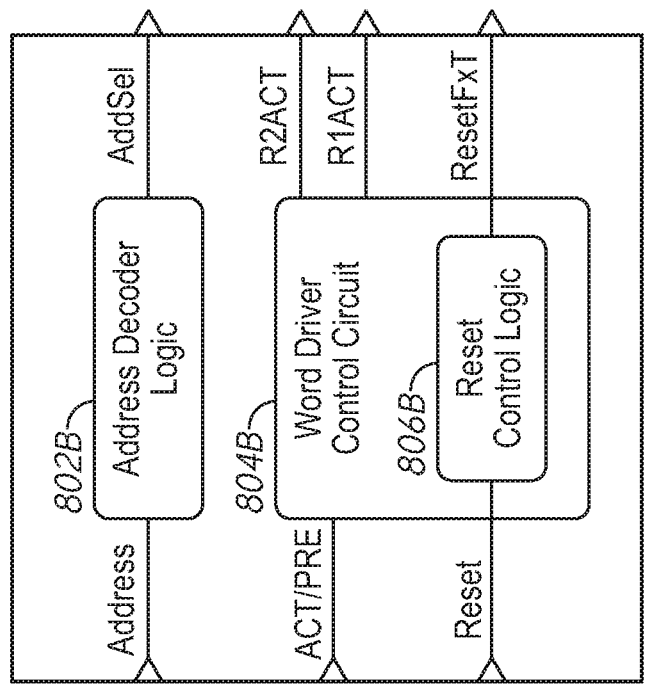
FIGS. 8A and 8B are block diagrams of row decoder circuits according to embodiments of the disclosure.
Figure 8A:
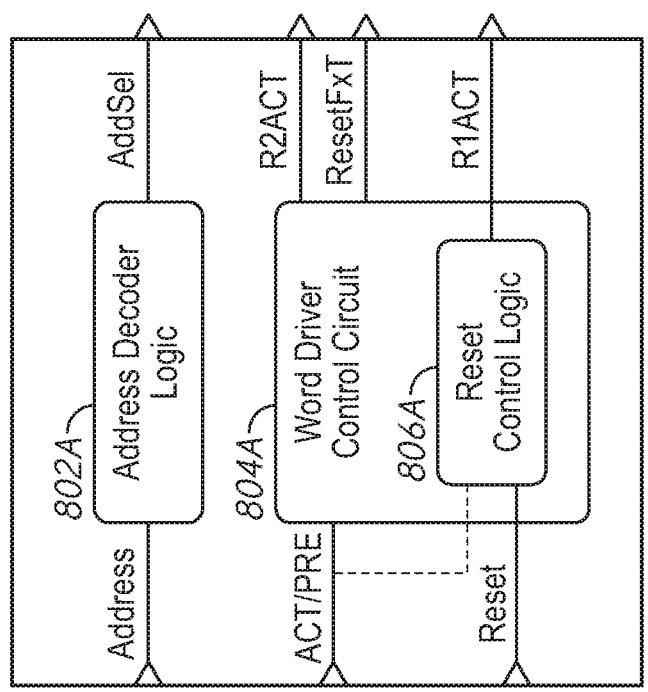

FIGS. 8A and 8B are block diagrams of address decoder logic 802A and 802B and word driver control circuits 804A and 804B, respectively according to embodiments of the disclosure. The address decoder logic and/or word driver control circuits shown in FIGS. 8A and 8B may be included in the row decoder circuit 12 in FIG. 1 in some embodiments. In some embodiments, the address decoder logic and/or word driver control circuits shown in FIGS. 8A and 8B may provide one or more signals to a word driver, for example, word drivers FXD in FIGS. 1, 3, 4, and word driver FXD 700 in FIG. 7.

Focusing on FIG. 8A, the word driver control circuit 804A may include reset control logic 806A. The address decoder logic 802A may receive an address (e.g., XADD) and provide address select signal AddSel. In some embodiments, the address may be provided by an address decoder circuit, such as address decoder circuit 32 shown in FIG. 1. The address decoder logic 802A may provide an active AddSel signal to a word driver associated with the received address.

The word driver control circuit 804A may receive activation signal ACT or precharge signal PRE and reset signal Reset. The word driver control circuit 804A may provide control signals R2ACT, ResetFxT, and R1ACT. In some embodiments, ACT/PRE and Reset may be provided by a command decoder circuit, such as command decoder circuit 34 shown in FIG. 1. In some embodiments, the word driver control circuit 804A may activate or deactivate R2ACT and ResetFxT based, at least in part, on receiving an active activation signal ACT or precharge signal PRE.

In some embodiments, the Reset signal may be received by reset control logic 806A. The reset control logic 806A may transition a state of the R1ACT based, at least in part, on the Reset signal. In some embodiments, the state of R1ACT may be based, at least in part, on both the ACT/PRE and the Reset signal.

Turning to FIG. 8B, the word driver control circuit 804B may include reset control logic 806B. The address decoder logic 802B may receive an address (e.g., XADD) and provide address select signal AddSel. In some embodiments, the address may be provided by an address decoder circuit, such as address decoder circuit 32 shown in FIG. 1. The address decoder logic 802B may provide an active AddSel signal to a word driver associated with the received address.

The word driver control circuit 804B may receive activation signal ACT or precharge signal PRE and reset signal Reset and provide control signals R2ACT, ResetFxT, and R1ACT. In some embodiments, ACT/PRE and Reset may be provided by a command decoder circuit, such as command decoder circuit 34 shown in FIG. 1. In some embodiments, the word driver control circuit 804B may activate or deactivate R2ACT and R1ACT based, at least in part, on receiving an active activation signal ACT or precharge signal PRE. In some embodiments, the Reset signal may be received by reset control logic 806B. The reset control logic 806B may transition a state of the ResetFxT based, at least in part, on the Reset signal.

In some embodiments, the word driver control circuits 804A and 804B may be combined into a single row decoder. Additional logic (not shown) may be provided to select a mode of operation of the row decoder. In some embodiments, a memory device may include both word driver control circuits 804A and 804B and a selection signal (not shown) may be provided to select the word driver control circuit used for a memory operation. Other combinations of word driver control circuits 804A and 804B may also be used to provide the functionality of both row decoder circuits.

Figure 9:
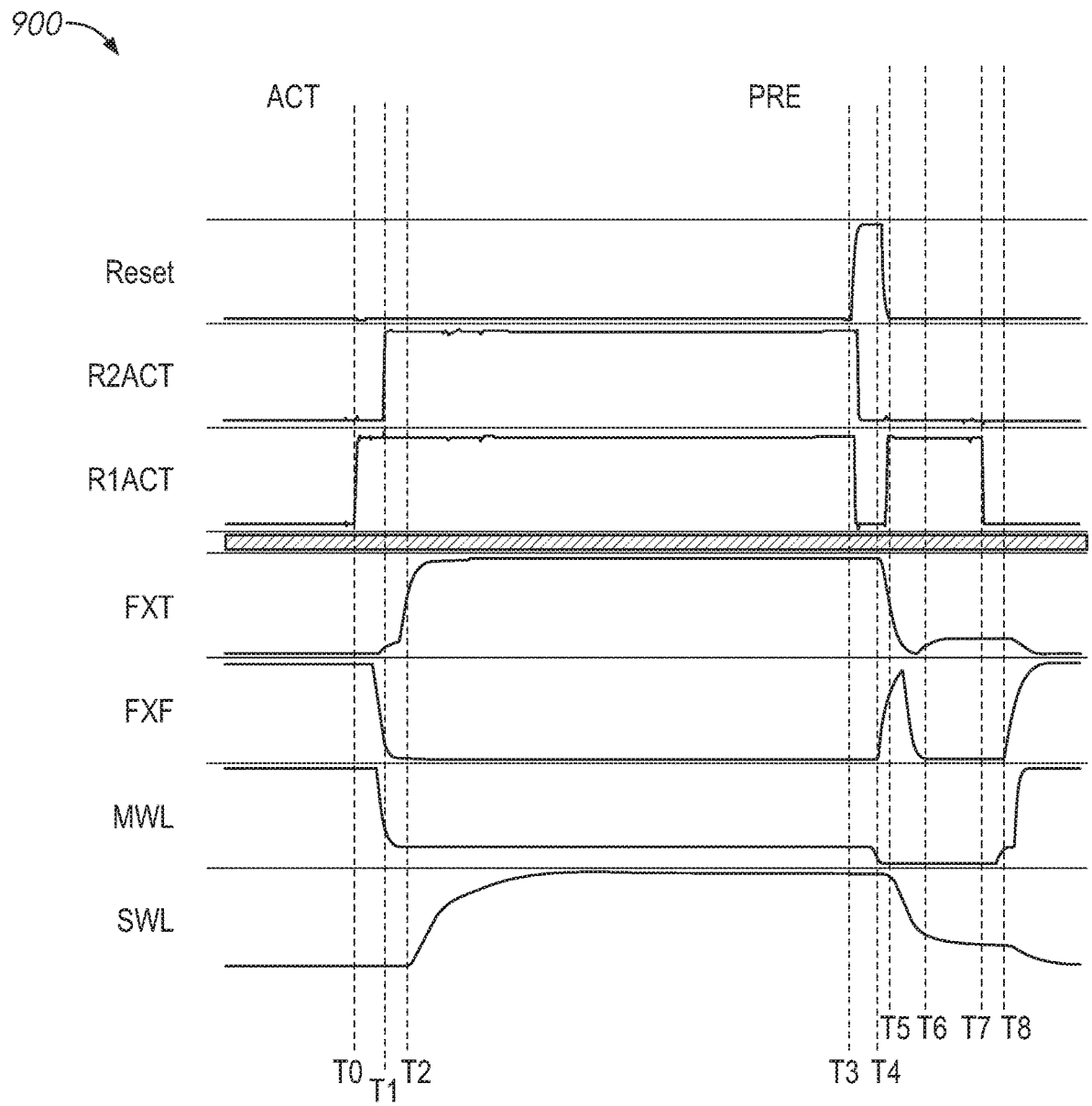
FIG. 9 is a timing diagram of various signals during operation of a driver circuit according to an embodiment of the disclosure.

FIG. 9 is a timing diagram 900 of various signals during an operation of a driver circuit and word driver control circuit according to an embodiment of the disclosure. In some embodiments, timing diagram 900 may show the operation of a driver circuit and FX driver control circuit during a memory access operation (e.g., activation). In some embodiments of the disclosure, the driver circuit of FIG. 7 and the word driver control circuit 804A may be operated according to the example operation of timing diagram 900. The timing diagram 900 will be described with reference to the driver circuit of FIG. 7 and the word driver control circuit 804A shown in FIG. 8A. However, the example of FIG. 9 is not limited to the specific embodiment of the FXD 700 and word driver control circuit 804A.

Timing diagram 900 shows the states of control signals Reset, R2ACT, and R1ACT. Timing diagram 900 further shows the states of driving signals FXT, FXF, main word line MWL, and sub word line SWL. MWL may be provided by a main word driver MWD, such as a main word driver shown in FIGS. 1, 3, 4, and/or MWD 500 shown in FIG. 5. While the state of MWL is shown for context in timing diagram 900, the specific operation of MWL shown in timing diagram 900 is not required for operation of the driver circuit, such as FXD 700 shown in FIG. 7 or word driver control circuit 804A shown in FIG. 8A. In some embodiments, the signals R2ACT, R1ACT may be provided by a word driver control circuit, such as word driver control circuit 804A shown in FIG. 8A. In some embodiments, the Reset signal may be received by the word driver control circuit.

Sometime before T0, an activation command is received by a memory device that includes the word driver. In response, an internal activation signal ACT may transition to an active state. The activation signal ACT may be received by a word driver control circuit, such as word driver control circuit 40 shown in FIG. 1. Responsive to the activation signal ACT, the word driver control circuit may transition R1ACT to an active state (e.g., a high potential in the example shown in FIG. 9) at or around T0. Although not shown in FIG. 9, an address signal may be provided at or near the time of the internal activation signal ACT. The word driver control circuit may transition an address select AddSel signal (not shown in FIG. 9) to an active state.

Responsive to the active AddSel and R1ACT signals, the FXF driver 760 may drive FXF to an active state (e.g., a low potential in the example shown in FIG. 9). More specifically, the active AddSel and R1ACT signals may activate transistors N9, N10, P6, and N14 and deactivate transistors P4, P5, N12, and P7. This may drive FXF to VSS through N14 at or around T1. The low FXF signal may deactivate transistor N5 and activate transistor P3.

Further responsive to the ACT signal, the R2ACT may transition to an active state (e.g., a high potential in the example shown in FIG. 9) at or around T1. This may cause the FXT driver 750 to transition FXT to an active state (e.g., a high potential as shown in FIG. 9) at or around T2. Specifically, the active R2ACT signal may activate transistor P2 and deactivate transistor N4 and drive FXT to VCCP through P2 and P3. Furthermore, since FXF is low, transistor N5 is inactive, so FXT is not coupled to VSS through N5. Although not shown in FIG. 9, the FXT driver 750 may receive a ResetFxT signal, but the state of ResetFxT is not relevant when transistor N4 is inactive.

As shown in FIG. 9, at or around T1, the MWL may be driven to an active state (e.g., a low potential as shown in FIG. 9). Responsive to the activation of driving signals FXT and FXF and MWL, the subword line SWL is driven to an active state (e.g., a high potential in the example shown in FIG. 9) at or around T2. For example, with reference to FIG. 7, transistor P1 of the SWD 702 is activated and transistors N1 and N2 are deactivated and SWL is driven to VCCP via transistor P1.

At some time before T3, a precharge command may be received. Responsive to the precharge command, an active internal precharge signal PRE is provided. In response to the precharge signal PRE, the word driver control circuit may transition R2ACT to an inactive state (e.g., a low potential in the example shown in FIG. 9) at or around T3. The inactive R2ACT signal may activate N4 and deactivate P2. This may begin to drive FXT to a low potential through N4 at or around T4. Whether FXT is driven toward low potential VOFF or low potential VSS may depend, at least in part, on the state of ResetFxT.

Also at or around T3, the Reset signal transitions to an active state (e.g., a high potential in the example shown in FIG. 9). In some embodiments, the Reset signal may activate responsive to the precharge signal PRE. In other embodiments, the Reset signal may transition independently of the precharge signal PRE. Responsive to the active Reset signal, the word driver circuit may transition R1ACT to an inactive state (e.g., a low potential in the example shown in FIG. 9) at or around T3. This may deactivate transistors N10, P6, and N14 and activate transistors P5, N12, and P7. As a result, FXF may be driven to an inactive state (e.g., a high potential in the example shown in FIG. 9) at or around T4. This temporary deactivation of FXF may be referred to as resetting FXF. By "temporary" or "temporarily," it is meant that a signal does not remain in a state for a duration, or remaining duration, of when the signal is typically in an active or inactive period of the signal during a memory operation. The inactive FXF signal may deactivate transistor P3 and activate transistor N5. This causes FXT to be driven toward VSS as it is disconnected from VCCP at transistor P2 and connected to a path to a low potential by transistor N5.

As FXF is driven to the inactive state, transistor N2 is activated, which couples FXT (via transistor P1) and SWL to a low potential (e.g., VNWL in the example shown in FIG. 9). Thus, FXT continues to discharge and SWL begins to discharge toward the low potential through N2 at or around T5. In some embodiments, FXF may transition at a time such that FXT does not float and its discharge is not interrupted.

At or around T4, Reset returns to an inactive state (e.g., a low potential in the example shown in FIG. 9). In response to the inactive Reset signal, the word driver circuit may transition R1ACT back to the active state at or around T4. This may again activate transistors N10, P6, and N14 and deactivate transistors P5, N12, and P7 to drive FXF back towards the active state at or around T5. The active FXF signal may deactivate transistors N2 and N5 and reactivate transistor P3. This may allow FXT to be driven to VSS or VOFF through the FXT driver 750 at or around T6. Which low potential VSS or VOFF, may be determined based on the state of ResetFxt. In the example shown in FIG. 9, FXT is driven to VOFF at or around T6. Thus, in this example, ResetFxT is at a low potential at T6. Because transistor N2 is deactivated, SWL is driven to a same potential as FXT at or around T6. In this example, SWL is driven to VOFF.

The magnitude of the drop in potential of SWL while FXF is temporarily deactivated may be based, at least in part, on a time period for which FXF is deactivated. The length of time FXF is deactivated may be based, at least in part, on a width of the Reset pulse (e.g., the time period the Reset signal is active). Thus, if it is desired for SWL to further discharge to VNWL, the Reset pulse could be widened. If a lower magnitude drop in potential for SWL is desired, the Reset pulse could be shortened.

At T7, the word driver control circuit may transition R1ACT to the inactive state. This may be responsive to the precharge command, timing logic, and/or other signal. This may cause FXF to be driven to the inactive state at or around T8 as previously described. In some embodiments, ResetFxT may transition to a high potential and activate transistor N6 and deactivate transistor N7, which may cause FXT to be driven to VSS at T8. However, in other embodiments, FXT may have already been driven to VSS at T6. Waiting until a later time to drive FXT from VOFF toward VSS may allow the SWL to discharge toward VOFF rather than VSS immediately, thereby controlling the discharge of the SWL from active to inactive. Also at T8, MWL may transition to an inactive state (e.g., a high potential in the example shown in FIG. 9). The inactive FXF and MWL may deactivate P1 and activate N1 and N2, which may drive SWL to VNWL at or around T8 (e.g., from VOFF of FXT to VNWL).

Although MWL is shown being driven to a negative voltage following T3, the MWL need not be driven to the negative voltage for control of the discharge of the SWL by the driving signals FXF and FXT. That is, MWL may remain at a single low potential (e.g., VSS, 0V) for the entire time it is activated in some embodiments. However, driving MWL to the negative voltage as shown in timing diagram 900 may provide additional control over the discharge of the SWL in some embodiments. That is, the discharge of the SWL may be controlled by both a main word driver MWD and a word driver FXD during a memory operation.

When the word driver FXD 700 is operated in the manner described with reference to timing diagram 900, in some embodiments, FXD 700 may be modified to eliminate transistors N6 and N7 and signal ResetFxT. Instead, transistor N4 may be directly coupled to a low potential such as VSS or VOFF. In these embodiments, FXT would be driven directly to the low potential (e.g., VSS) at or around T6 and not to a first low potential (e.g., VOFF through transistor N7) followed by a second low potential (e.g., VSS through transistor N6) as shown in timing diagram 900.

In the embodiment shown in FIG. 9, SWL may be discharged through transistor N2 during the reset of FXF. As a result, the discharge of SWL may be controlled by resetting of the FXF (e.g., width of the FXF being reset). In some applications, it may be undesirable for SWL to reach VNWL while the Reset signal is active. In some applications, SWL may discharge rapidly and controlling a width of the Reset pulse to prevent SWL from reaching VNWL (or another undesirable low potential) may be difficult. In these situations, it may be desirable to discharge SWL through a more gradual pathway.

Figure 10:
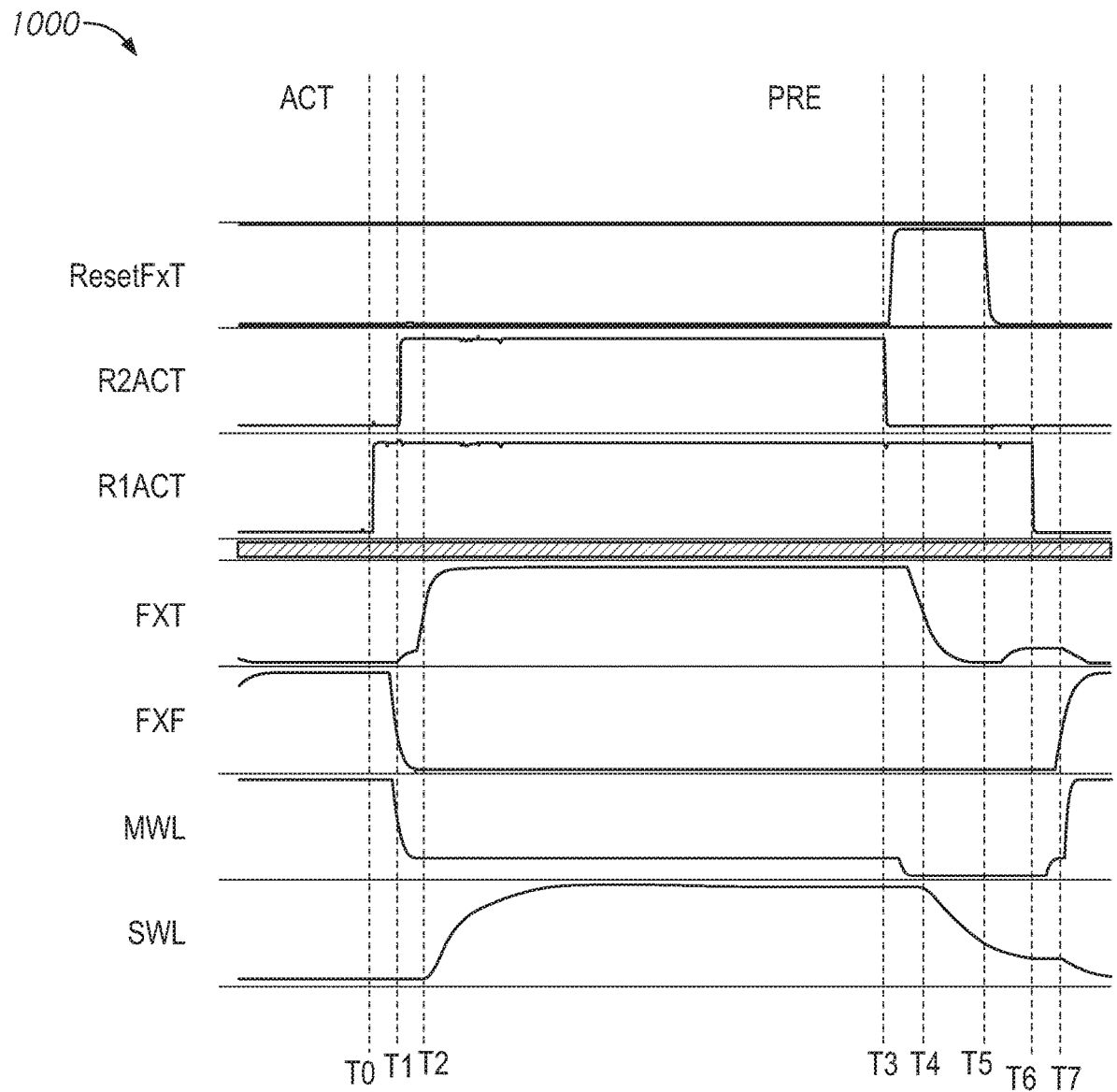
FIG. 10 is a timing diagram of various signals during operation of a driver circuit according to an embodiment of the disclosure.

FIG. 10 is a timing diagram 1000 of various signals during an operation of a driver circuit and word driver control circuit according to an embodiment of the disclosure. In some embodiments, timing diagram 1000 may show the operation of a driver circuit and word driver control circuit during a memory access operation (e.g., activation). In some embodiments of the disclosure, the driver circuit of FIG. 7 and word driver control circuit 804B may be operated according to the example operation of timing diagram 1000. The timing diagram 1000 will be described with reference to the driver circuit of FIG. 7 and word driver control circuit 804B of FIG. 8B. However, the example of FIG. 10 is not limited to the specific embodiment of the FXD 700 and word driver control circuit 804B.

Timing diagram 1000 shows the states of control signals ResetFxT, R2ACT, and R1ACT. Timing diagram 1000 further shows the states of FXT, FXF, MWL, and SWL. MWL may be provided by a main word driver MWD, such as a main word driver shown in FIGS. 1, 3, 4, and/or MWD 500 shown in FIG. 5. While the state of MWL is shown for context in timing diagram 1000, the specific operation of MWL shown in timing diagram 1000 is not required for operation of the driver circuit such as FXD 700 shown in FIG. 7 and word driver control circuit 804B shown in FIG. 8B. In some embodiments, the signals ResetFxT, R2ACT, and R1ACT may be provided by a word driver control circuit, such as word driver control circuit 804B shown in FIG. 8B.

Sometime before T0, an activation command is received by a memory device that includes the word driver. In response, an internal activation signal ACT may transition to an active state. The activation signal ACT may be received by a word driver control circuit, such as word driver control circuit 40 shown in FIG. 1. Responsive to the activation signal ACT, the word driver control circuit may transition R1ACT to an active state (e.g., a high potential in the example shown in FIG. 10) at or around T0. Although not shown in FIG. 10, an address signal may be provided at or near the time of the activation signal ACT. The word driver control circuit may transition an address select AddSel signal (not shown in FIG. 10) to an active state.

Responsive to the active AddSel and R1ACT signals, the FXF driver 760 may drive FXF to an active state (e.g., a low potential in the example shown in FIG. 10). More specifically, the active AddSel and R1ACT signals may activate transistors N9, N10, P6, and N14 and deactivate transistors P4, P5, N12, and P7. This may drive FXF to VSS through N14 at or around T1.

Further responsive to the ACT signal, the R2ACT may transition to an active state (e.g., a high potential in the example shown in FIG. 10) at or around T1. This may cause the FXT driver 750 to transition FXT to an active state (e.g., a high potential as shown in FIG. 10) at or around T2. Specifically, the active R2ACT signal may activate transistor P2 and deactivate transistor N4 and drive FXT to VCCP through P2. Furthermore, since FXF is low, transistor P3 is active, but transistor N5 is inactive, so FXT is not coupled to VSS through N5. The FXT driver 750 may receive an inactive (e.g., low potential in the example shown in FIG. 10) ResetFxT signal. This activates N7 and deactivates N6. However, the state of ResetFxT is not relevant to the state of FXT when transistor N4 is inactive.

As shown in FIG. 10, at or around T1, the MWL may be driven to an active state (e.g., a low potential as shown in FIG. 10). Responsive to the activation of driving signals FXT and FXF and MWL, the subword line SWL is driven to an active state (e.g., a high potential in the example shown in FIG. 10) at or around T2. For example, with reference to FIG. 7, transistor P1 of the SWD 702 is activated and transistors N1 and N2 are deactivated and SWL is driven to VCCP via transistor P1.

At some time before T3, a precharge command may be received. Responsive to the precharge command, an active internal precharge signal PRE is provided. In response to the precharge signal PRE, the word driver control circuit may transition R2ACT to an inactive state (e.g., a low potential in the example shown in FIG. 10) at or around T3. The inactive R2ACT signal may activate N4 and deactivate P2. Also at or around T3, the ResetFxT signal may transition to an active state (e.g., a high potential in the example shown in FIG. 10). In some embodiments, the word driver control circuit may transition ResetFxt to the active state, based, at least in part, on receipt of an active Reset signal (not shown in FIG. 10). For example, responsive to an active Reset signal the word driver control circuit 804B of FIG. 8B provides the active ResetFxT signal. The active ResetFxT signal may activate transistor N6 and deactivate transistor N7. As a result FXT is driven to VSS. This temporary driving of the FXT to VSS (as opposed to VOFF) may be referred to as resetting FXT.

Because FXT begins discharging to VSS through transistor N6, the SWL begins discharging to the same potential as FXT through transistor P1 at or around T4. However, the discharge of SWL may be limited by the voltage difference between the gate and source of P1 (e.g., the active low potential of MWL and the decreasing potential of SWL). Thus, while SWL may be driven toward the same potential as FXT, it may not reach the potential of FXT while FXT is reset.

At or around T5, the word driver circuit may return ResetFxT to an inactive state (e.g., a low potential as shown in FIG. 10). This may activate transistor N7 and deactivate transistor N6. Thus, FXT may be driven to VOFF via transistor N7 at or around T5. In some embodiments, returning FXT to a second low potential (e.g., VOFF) greater than the first low potential (e.g., VSS) may reduce the current drivability of transistor P1. In some applications, keeping FXT at the first low potential may be desirable to increase the current drivability of transistor P1 as it may allow SWL to discharge more quickly. However, in other applications, reducing the current drivability of transistor P1 (e.g., switching FXT to the higher second low potential sooner) may reduce the effect of fluctuations of process-dependent characteristics of the transistor P1. This may reduce difficulties in timing unification across word drivers.

At T6, the word driver control circuit may transition R1ACT to the inactive state (e.g., a low potential in the example shown in FIG. 10). This may be responsive to the active precharge signal PRE, timing logic, and/or other signal. The inactive R1ACT signal may deactivate transistors N10, P6, and N14 and activate transistors P5, N12, and P7. As a result, FXF may be driven to an inactive state (e.g., a high potential in the example shown in FIG. 10) at or around T7. The inactive FXF signal may deactivate transistor P3 and activate transistor N5. Also at or around T7, MWL may transition to an inactive state (e.g., a high potential in the example shown in FIG. 9). The inactive FXF and MWL may deactivate P1 and activate N1 and N2, which may drive FXT and SWL to VNWL at or around T7.

Although MWL is shown being driven to a negative voltage following T3, the MWL need not be driven to the negative voltage for control of the discharge of the SWL by the driving signals FXF and FXT as shown in FIG. 10. That is, MWL may remain at a single low potential (e.g., VSS, 0V) for the entire time MWL is activated in some embodiments. However, driving MWL to the negative voltage as shown in timing diagram 1000 may provide additional control over the discharge of the SWL in some embodiments. That is, the discharge of the SWL may be controlled by both a main word driver MWD and a word driver FXD during a memory operation.

The apparatuses and methods described herein may control the discharge of a subword line. For example, the rate of discharge and/or the voltage to which the subword line discharges may be controlled. As described herein, in some embodiments, the discharge of the subword line may be controlled by driving a main word line MWL to a first low potential and subsequently to a second low potential, less than the first potential. The second low potential may be a negative voltage. In some embodiments, the MWL may be driven to a single low potential having a negative voltage. In some embodiments, the discharge of the subword line may be controlled by resetting a first word driver line signal and/or a second word driver line signal. In some embodiments, the discharge of the subword line may be controlled by a combination of driving a main word line MWL and resetting a first word driver line signal and/or a second word driver line signal. In some applications, controlling the discharge of the subword line as described herein may reduce the effects of a row hammer event.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a subword driver configured to drive a subword line, wherein the subword driver includes a transistor coupled to the subword line at a first node;
   a word driver control circuit configured to provide a first control signal and a second control signal; and
   a word driver configured to receive the first and second control signals and provide a first driving signal to a second node of the transistor of the subword driver, the word driver configured to provide the first driving signal in an active state based on the first control signal and provide the first driving signal in an inactive state having a potential based on the second control signal.

2. The apparatus of claim 1, wherein the first control signal is based, at least in part, on an activation signal and the second control signal is based, at least in part, on a reset signal.

3. The apparatus of claim 2, wherein the activation signal and the reset signal are provided by a command decoder circuit.

4. The apparatus of claim 1, wherein the subword line is driven to the potential of the first driving signal when the transistor is activated.

5. The apparatus of claim 4, wherein the transistor comprises a P-channel transistor and the P-channel transistor is activated by a main word line.

6. The apparatus of claim 1, wherein the word driver comprises a driving signal driver configured to receive the first control signal and the second control signal and provide the first driving signal, wherein the driving signal driver is configured to:
   drive the first driving signal to a high potential when the first control signal is active; drive the first driving signal to a first low potential when the first control signal is inactive and the second control signal is active; and
   drive the first driving signal to a second low potential when the first control signal is inactive and the second control signal is inactive, wherein the first potential is less than the second potential.

7. The apparatus of claim 6, wherein the driving signal driver comprises:
   a first P-channel transistor configured to be coupled to the high potential at a first node;
   a second P-channel transistor coupled to a second node of the first P-channel transistor at a first node;
   a first N-channel transistor coupled to a second node of the second P-channel transistor at a first node, wherein a gate of the first P-channel transistor and a gate of the first N-channel transistor are configured to receive the first control signal inverted;
   a second N-channel transistor coupled to the second node of the second P-channel transistor at a first node, wherein a gate of the second P-channel transistor and a gate of the second N-channel transistor are configured to receive a second driving signal from the word driver circuit;
   a third N-channel transistor coupled to a second node of the first N-channel transistor at a first node and the first low potential at a second node, wherein a gate of the third N-channel transistor is configured to receive the second control signal; and
   a fourth N-channel transistor coupled to the second node of the first N-channel transistor at a first node and the second low potential at a second node, wherein a gate of the fourth N-channel transistor is configured to receive the second control signal inverted.

8. The apparatus of claim 7, wherein the driving signal driver further comprises a fifth N-channel transistor coupled between the second P-channel transistor and the second N-channel, wherein a gate of the fifth N-channel transistor is coupled to an activating potential.

9. The apparatus of claim 7, wherein the first driving signal and the subword line are driven toward a third low potential when the second driving signal is inactive.

10. The apparatus of claim 9, wherein the third low potential is equal to the first low potential.

11. The apparatus of claim 7, wherein the second driving signal is based, at least in part, by a third control signal provided by the word driver control circuit.

12. The apparatus of claim 11, wherein the third control signal is based, at least in part on the activation signal.

13. The apparatus of claim 1, further comprising a main word driver coupled to a gate of the transistor by a main word line.

14. A method, comprising:
driving a subword line to an active potential of a word driver line responsive to an activation command;
discharging the subword line to a first inactive potential of the word driver line responsive to a precharge command and an active reset signal;
changing the first inactive potential of the word driver line to a second inactive potential responsive to an inactive reset signal, wherein the second inactive potential is greater than the first inactive potential; and
discharging the subword line toward the second low potential.

15. The method of claim 14, wherein the active reset signal is received after the precharge command.

16. The method of claim 14 further comprising driving a main word line to an active potential to select a subword driver coupled to the subword line.

17. The method of claim 14, further comprising driving a second word driver line to an active state, wherein the word driver line is driven to the active potential, based at least in part, on the active state of the second word driver line.

18. A method, comprising:
driving a word driver line to an active potential responsive to an activation command;
providing the active potential of the word driver line to a subword line;
driving the word driver line to a first inactive potential responsive to a precharge command and an active reset signal;
providing the first inactive potential to the subword line;
driving the word driver line to a second inactive potential that is greater than the first inactive potential responsive to an inactive reset signal; and
providing the second inactive potential to the subword line.

19. The method of claim 18, wherein providing the active potential, the first inactive potential, and the second inactive potential of the word driver line to the subword line comprises activating a transistor coupled between the word driver line and the subword line.

20. The method of claim 18, further comprising:
selecting a word driver coupled to the word driver line; and
selecting a subword driver coupled to the subword line.

* * * * *